United States Patent
Najafi

(10) Patent No.: US 10,197,440 B2
(45) Date of Patent: Feb. 5, 2019

(54) NIOBIUM-GERMANIUM SUPERCONDUCTING PHOTON DETECTOR

(71) Applicant: PsiQuantum Corp, Palo Alto, CA (US)

(72) Inventor: Faraz Najafi, Palo Alto, CA (US)

(73) Assignee: PSIQUANTUM CORP., Palo Alto, CA (US)

( * ) Notice: Subject to any disclaimer, the term of this patent is extended or adjusted under 35 U.S.C. 154(b) by 0 days.

(21) Appl. No.: 16/012,520

(22) Filed: Jun. 19, 2018

(65) Prior Publication Data

US 2018/0364097 A1 Dec. 20, 2018

Related U.S. Application Data

(63) Continuation of application No. PCT/US2018/037892, filed on Jun. 15, 2018.

(60) Provisional application No. 62/520,447, filed on Jun. 15, 2017.

(51) Int. Cl.
*G01J 1/42* (2006.01)
*H01L 39/22* (2006.01)
*H01L 31/113* (2006.01)

(52) U.S. Cl.
CPC .............. *G01J 1/42* (2013.01); *H01L 31/113* (2013.01); *H01L 39/228* (2013.01)

(58) Field of Classification Search
CPC ......... G01J 1/42; H01L 31/113; H01L 39/228
USPC ...................................................... 250/336.2
See application file for complete search history.

(56) References Cited

U.S. PATENT DOCUMENTS

| 3,119,076 A | 1/1964 | Schlig et al. |
| 5,030,614 A | 7/1991 | Hollander et al. |
| 5,455,519 A | 10/1995 | Ohori |
| 5,481,119 A | 1/1996 | Higashino et al. |
| 9,509,315 B2 | 11/2016 | McCaughan et al. |

(Continued)

FOREIGN PATENT DOCUMENTS

| CN | 106549099 | * 3/2017 | ............ H01L 39/02 |
| EP | 0299879 A2 | 1/1989 | |
| GB | 2530500 A | 3/2016 | |

OTHER PUBLICATIONS

Natarajan et al. "Superconducting nanowire single-photon detectors: physics and applications", 2012, Superconduc. Sci. Technology vol. 25, p. 063001.*

(Continued)

*Primary Examiner* — David Porta
*Assistant Examiner* — Meenakshi Sahu
(74) *Attorney, Agent, or Firm* — Morgan, Lewis & Bockius LLP

(57) ABSTRACT

The various embodiments described herein include methods, devices, and systems for fabricating and operating niobium-germanium-based superconducting devices. In one aspect, a device includes a superconducting nanowire composed of niobium-germanium, a protective layer configured to inhibit oxidation of the superconducting nanowire, and a current source configured to supply a current to the superconducting nanowire. In another aspect, a method of fabrication includes: (1) depositing a layer of niobium-germanium on a substrate; (2) removing one or more portions of the layer of niobium-germanium to define one or more nanowires; and (3) depositing a protective layer over the one or more nanowires, the protective layer adapted to inhibit oxidation of niobium-germanium in the one or more nanowires.

21 Claims, 19 Drawing Sheets

(56) References Cited

U.S. PATENT DOCUMENTS

2013/0143744 A1 6/2013 Marsili et al.
2014/0299751 A1 10/2014 Tang et al.

OTHER PUBLICATIONS

McGaughan, "Superconducting thin film nanoelectronics," Sep. 2015, Massachusetts Institute of Technology, submitted to the Department of Electrical Engineering and Computer Science in partial fulfillment of the requirements for the degree of Doctor of Philosopy in Electrical Engineering, 22 pgs.
PsiQuantum Corp., Invitation to Pay Additional Fees, PCT/US2018/037892, Aug. 20, 2018, 16 pgs.

\* cited by examiner

NIOBIUM-GERMANIUM SUPERCONDUCTING PHOTON DETECTOR

PRIORITY AND RELATED APPLICATIONS

This application is a continuation of International (PCT) Patent Application PCT/US2018/037892, filed Jun. 15, 2018, entitled "Niobium-Germanium Superconducting Photon Detector," which claims priority to U.S. Provisional Application No. 62/520,447, filed Jun. 15, 2017, entitled "Niobium-Germanium Superconducting Photon Detector," each of which is incorporated by reference herein in its entirety.

This application is related to International (PCT) Patent Application PCT/US18/33041, filed May 16, 2018, entitled "Gated Superconducting Photon Detector," International (PCT) application PCT/US18/33042, filed May 16, 2018, entitled "Superconducting Signal Amplifier," U.S. Provisional Application No. 62/591,600, filed Nov. 28, 2017, entitled "Nanowire Transistor," U.S. Provisional Application No. 62/585,436, filed Nov. 13, 2017, entitled "Methods and Devices for Impedance Multiplication," and U.S. Provisional Application No. 62/660,192, filed Apr. 19, 2018, entitled "Superconducting Field-Programmable Gate Array," each of which is incorporated by reference herein in its entirety.

TECHNICAL FIELD

This relates generally to superconducting devices, including but not limited to, superconducting photon detectors composed of niobium-germanium (also referred to herein as niobium germanide or $Nb_xGe$).

BACKGROUND

Photon detectors are essential components in many electronic devices. Ultra-sensitive photon detectors that are capable of detecting a small number of photons, such as individual photons (e.g., single photons), are used in a variety of applications, such as optical communications, medical diagnostics, and space research. One such use of ultra-sensitive photon detectors is for optical quantum information applications.

Superconductors are materials capable of operating in a superconducting state with zero electrical resistance under particular conditions.

SUMMARY

There is a need for systems and/or devices with more efficient and effective methods for detecting photons. Such systems, devices, and methods optionally complement or replace conventional systems, devices, and methods for detecting photons.

Many superconductors require very low temperatures to operate in a superconducting state. However, operating superconducting circuitry at these low temperatures can be challenging. Achieving temperatures near absolute zero (e.g., via the use of lasers and/or magnetic fields), such as less than 1 Kelvin (K), 1-2 Kelvin, or 2-3 Kelvin, often requires high performance cooling systems that are large and costly. In particular, the challenges become significant as the desired temperature approaches zero. In addition, it is difficult to maintain the near-zero temperature due to high cooling power needed for reliable operation of many superconducting circuits. Therefore, there is a great need for superconducting circuitry that is capable of operating in a superconducting state at higher temperatures (e.g., 3-4 Kelvin, 4-5 Kelvin, 5-10 Kelvin, etc.) and having consistent efficiency throughout an operational temperature range (e.g., 3-6 Kelvin). The present disclosure describes various embodiments of such superconducting circuitry.

In one aspect, some embodiments include a photodetector device having a superconducting nanowire composed of niobium-germanium, a current source configured to provide a current to the nanowire, and a protective substance (e.g., amorphous silicon) configured to inhibit oxidation of the nanowire. In some embodiments, the superconducting wire is adapted to operate in a superconducting state at temperatures above 3 Kelvin (e.g., 3.1 K to 10 K).

In another aspect, some embodiments include a method for detecting light, including: (1) maintaining a photodetector device having a superconducting nanowire composed of niobium-germanium in a superconducting state at a temperature above 3 Kelvin; (2) providing a first current to a photodetector device having a superconducting nanowire composed of niobium-germanium; and (3) detecting light incident to the superconducting nanowire. The light causes the superconducting nanowire to transition from the superconducting state to a non-superconducting state and causes redirection of the first current toward a readout circuit that is coupled to the first end of the second superconducting wire. The first current is less than a maximum superconducting current of the superconducting nanowire.

In yet another aspect, some embodiments include a method for fabricating a superconducting photodetector circuit, the method including: (1) depositing a thin film of niobium-germanium over a substrate; (2) removing one or more portions of the thin film to define a superconducting wire having a maximum superconducting current; and (3) providing a protective layer to the surface of the superconducting wire, the protective layer configured to inhibit oxidation of the superconducting wire.

Thus, devices and systems are provided with methods for fabricating and operating superconducting photodetector circuitry, thereby increasing the effectiveness, efficiency, accuracy, precision, and user satisfaction with such systems and devices.

BRIEF DESCRIPTION OF THE DRAWINGS

For a better understanding of the various described embodiments, reference should be made to the Detailed Description below, in conjunction with the following drawings in which like reference numerals refer to corresponding parts throughout the figures.

DETAILED DESCRIPTION

Figure 1A:
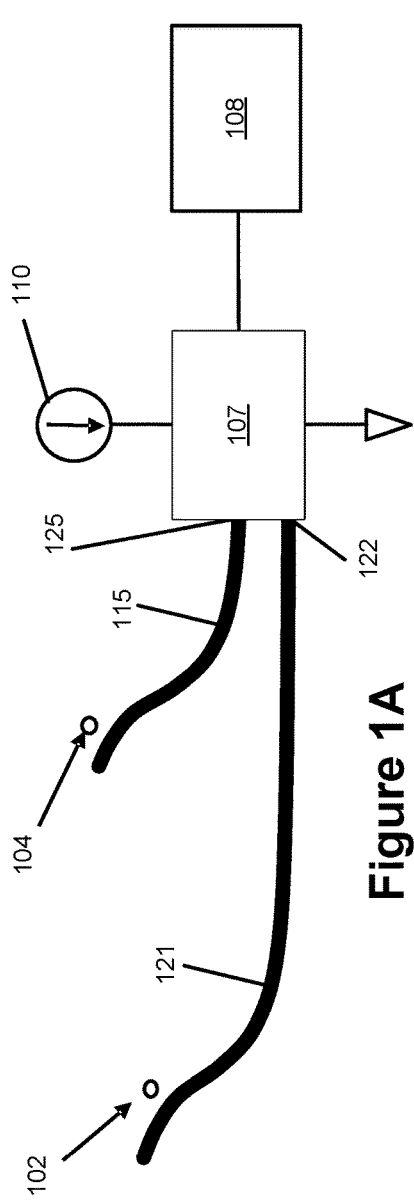
FIGS. 1A-1C illustrate a representative photonic circuit employing a gated superconducting photon detector in accordance with some embodiments.

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

Many modifications and variations of this disclosure can be made without departing from its spirit and scope, as will be apparent to those skilled in the art. The specific embodiments described herein are offered by way of example only, and the disclosure is to be limited only by the terms of the appended claims, along with the full scope of equivalents to which such claims are entitled.

As used herein, a "superconducting circuit" or "superconductor circuit" is a circuit having one or more superconducting materials. For example, a superconducting photodetector circuit is a photodetector circuit that includes one or more superconducting materials. As used herein, a "superconducting" material is a material that is capable of operating in a superconducting state (under particular conditions). For example, a material that operates as a superconductor (e.g., operates with zero electrical resistance) when cooled below a particular temperature (e.g., a critical temperature) and having less than a threshold current flowing through it. A superconducting material is also called herein a superconduction-capable material. The superconducting materials may also operate in an "off" state where little or no current is present. In some embodiments, the superconducting materials operate in a non-superconducting state during which the materials have a non-zero electrical resistance (e.g., a resistance in the range of one thousand to ten thousand ohms). For example, a superconducting material supplied with a current greater than a threshold superconducting current for the superconducting material may transition from a superconducting state with zero electrical resistance to a non-superconducting state with non-zero electrical resistance. As an example, superconducting wire 104 is a superconducting material that is capable of operating in a superconducting state (e.g., under particular operating conditions).

As used herein, a "wire" is a section of material configured for transferring electrical current. In some embodiments, a wire includes a section of material conditionally capable of transferring electrical current (e.g., a wire made of a superconducting material that is capable of transferring electrical current while the wire is maintained at a temperature below a critical temperature). A cross-section of a wire (e.g., a cross-section that is perpendicular to a length of the wire) optionally has a geometric (e.g., flat or round) shape or an irregular (also sometimes called a non-geometric) shape. In some embodiments, a length of a wire is greater than a width or a thickness of the wire (e.g., the length of a wire is at least 5, 6, 7, 8, 9, or 10 times greater than the width and the thickness of the wire).

As used herein, the term "light intensity" or simply "intensity" refers to the number of photons incident on a unit area, e.g., a superconducting wire, per unit time. The term "intensity" includes a situation where only a single photon is incident on the detector in a given time period and also includes a situation where multiple photons are incident on the detector in the given time period. For example, a first light pulse having a first intensity that is greater than a second light pulse having a second intensity includes a first light pulse that includes more photons than a second light pulse. For example, the first light pulse can include 10 photons or 100 photons, while the second light pulse can include one photon, two photons, . . . , 9 photons, etc.

Superconducting Components and Circuits

Figure 1B:
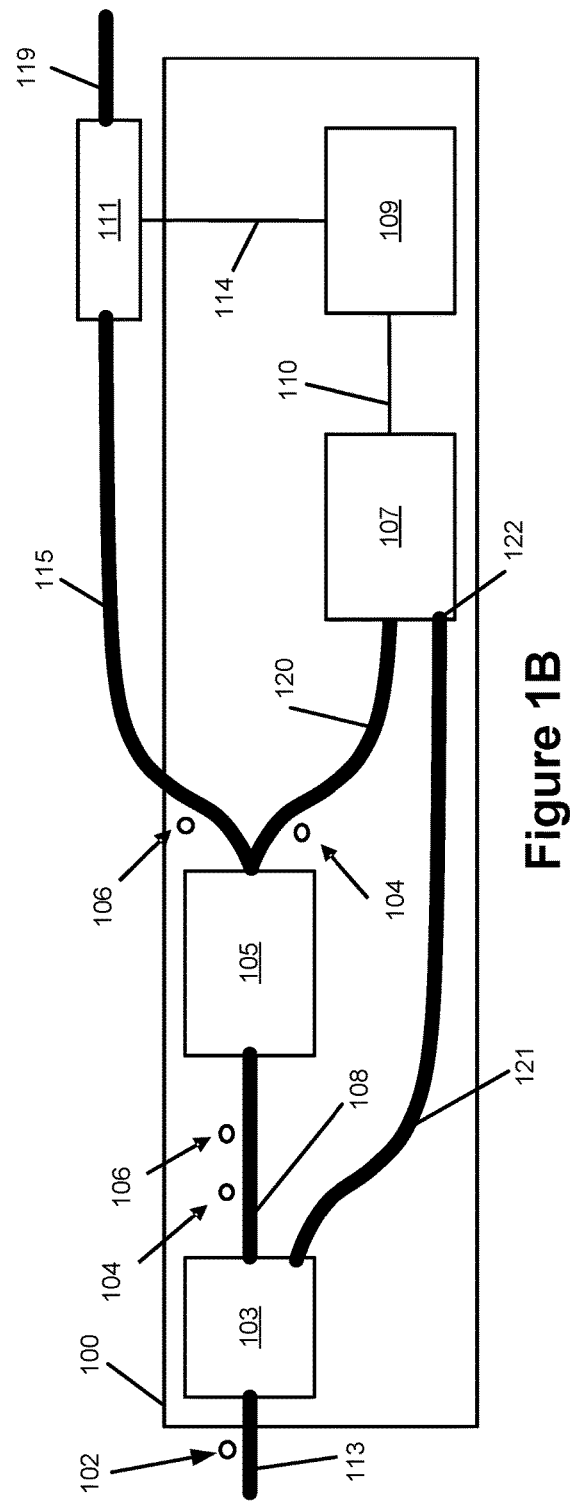

FIGS. 1A-1B illustrate a photonic circuit that employs a gated superconducting photon detector in accordance with one or more embodiments. The system includes a gating path waveguide 121 that is optically coupled to a gate input port 122 of a gated superconducting photon detector 107. The system further includes a detection path waveguide 115 that is optically coupled to a detection input port 125 of gated superconducting photon detector 107. For the sake of clarity, photons are depicted as open circles that are adjacent to a waveguide but one of ordinary skill will recognize that in the physical device, photons will propagate within a guided mode of the waveguide itself. The gated superconducting photon detector 107 can be of any type described below in reference to FIGS. 2A-4F. In operation, one or more gate photons 102 are generated by a gating photon source (not shown) and coupled into the gating path waveguide 121. In some embodiments, the gating photon source can be a pump photon source that is optically coupled to a photon pair generator for generating pairs of photons by a nonlinear process such as spontaneous four wave mixing and the like, as illustrated further in FIG. 1B below. However, any light source (that generates any number of photons, i.e., pulses of light) can be used for the gating photon source without departing from the scope of the present disclosure.

In some embodiments, the one or more gating photons 102 correspond to photons 406 described below in reference to FIG. 4B. Once absorbed, the action of the gating photons is to cause a transition from a superconducting state to a non-superconducting state in a superconducting gating wire (e.g., wire 302 shown in FIG. 4A-4F), thereby redirecting a bias current from current source 110 through another superconducting wire (e.g., wire 202, also referred to herein as the photon detection wire), as shown and described above in reference to, e.g., FIGS. 4A-4F. Once biased with the appropriate current, the superconducting photon detector 107 is ready to detect any photons 104 that are propagating within the detection path waveguide 115. Such photons can be generated from any source, e.g., from the same photon pair generator that was pumped by the gating photon source, as shown in FIG. 1B below, or from any external source of light without departing from the scope of the present disclosure.

As described in greater detail below, a detection of the photon 104 is accompanied by a transition of the wire 202 to a normal state thereby redirecting the current from current source 110 to the circuitry 108, which can be any downstream circuitry, e.g., an amplifier, switch, digital logic circuit.

The ability to optically trigger, i.e., gate the current biasing of the photon detection wire provides for a system with reduced dark counts. This is because before the gating photon is absorbed, there is no current flowing through the superconducting wire 202 and thus, absorption of a stray photon will not lead to any redirection of current to the circuitry 108.

FIG. 1B illustrates a heralded single photon source that employs a gated superconducting photon detector in accordance with one or more embodiments. Such a source can be used within any system for which a source of single photons is useful, e.g., within a quantum communications system and/or a quantum computer that employs entangled photons as the physical qubits.

A heralded single photon source 100 is illustrated in accordance with one or more embodiments. Thick black lines in the figure represent optical waveguides and thin black lines represent electrical interconnects (e.g. wires that may be formed from superconducting or non-superconducting materials). The system is a hybrid photonic/electrical circuit that includes a pumped photon pair generator 103, a wavelength division multiplexer (WDM) 105 (which is a 1×2 WDM in this example), a gated superconducting photon detector 107, an amplifier circuit 109, and an optical switch 111. One or more components of the system can be housed in a cryogenic environment, such as a cryostat, held at a temperature that is lower than the threshold temperature for superconductivity.

An input optical waveguide 113 optically couples a pump photon source (not shown) to photon pair generator 103. A pump photon 102 enters the pumped photon pair generator 103 via input optical waveguide 113. In some embodiments, the pumped photon pair generator 103 can include a non-linear optical material that generates two output photons, referred to as idler photon 104 and signal photon 106 from one or more input pump photons 102. For example, the pumped photon pair generator 103 can generate a pair of output photons using a process known as spontaneous four wave mixing. The pair of output photons, signal photon 104 and idler photon 106, are typically generated having different wavelengths/frequencies, e.g., with the sum of the energies of the signal and idler equal to the energy of the pump photon. After generation, signal photon 104 and idler photon 106 are optically coupled to the input of WDM 105 via waveguide 108. In addition, a surplus pump photon (not shown) can be coupled to the gating input 122 of the gated superconducting photon detector 107, via the gating path waveguide 121, (e.g., using a WDM or dichroic beam splitter that is internal to the pumped photon pair source 103). This gating photon is subsequently absorbed, initializing the gated superconducting photon detector 107 as described above. In other embodiments, the gating photon can be generated separately from the pump light, in any suitable way that is time correlated with the generation of the pump photons.

Because the signal and idler photons have different wavelengths/frequencies, WDM 105 redirects the idler and signal photons along different output waveguides, e.g., signal photon 104 is directed along the heralding waveguide path 120 and idler photon 106 is redirected along the switched output waveguide path 115. Which photon is directed to which path is not critical and the path of the idler photon and signal photon can be exchanged without departing from the scope of the present disclosure. In some examples, the gating can even be accomplished via electrical means, e.g., by way of one or more current pulses. One of ordinary skill will appreciate that many gating techniques and signals can be employed without departing from the scope of the present disclosure.

In this example, a gated superconducting photon detector 107, e.g., a gated superconducting nanowire single photon detector, is optically coupled to the heralding waveguide path 120 and can produce an electrical signal (e.g. a current pulse, also referred to as a photon heralding signal) in response to the gated detection of the signal photon 104. Because the signal photon 104 and idler photon 106 were generated nearly simultaneously as a pair, the electrical signal generated by the photon detector 107 signals (e.g., "heralds") the presence of the idler photon 106 in the switched waveguide path 115. The heralding signal is often a small amplitude current signal, e.g., microamps or less, and can be provided to an amplifier circuit 109, e.g., a superconducting nanowire current amplifier where it is amplified to a larger output signal that can be used to more effectively drive any downstream electronic and/or photonic circuits. The amplified signal is then provided to the optical switch 111 via output electrical signal line 114. After being switched, the idler photon 106 is provided via output waveguide 119, e.g., for use in constructing a highly entangled resource state for use in a downstream optical quantum computing system (not shown).

Figure 1C:
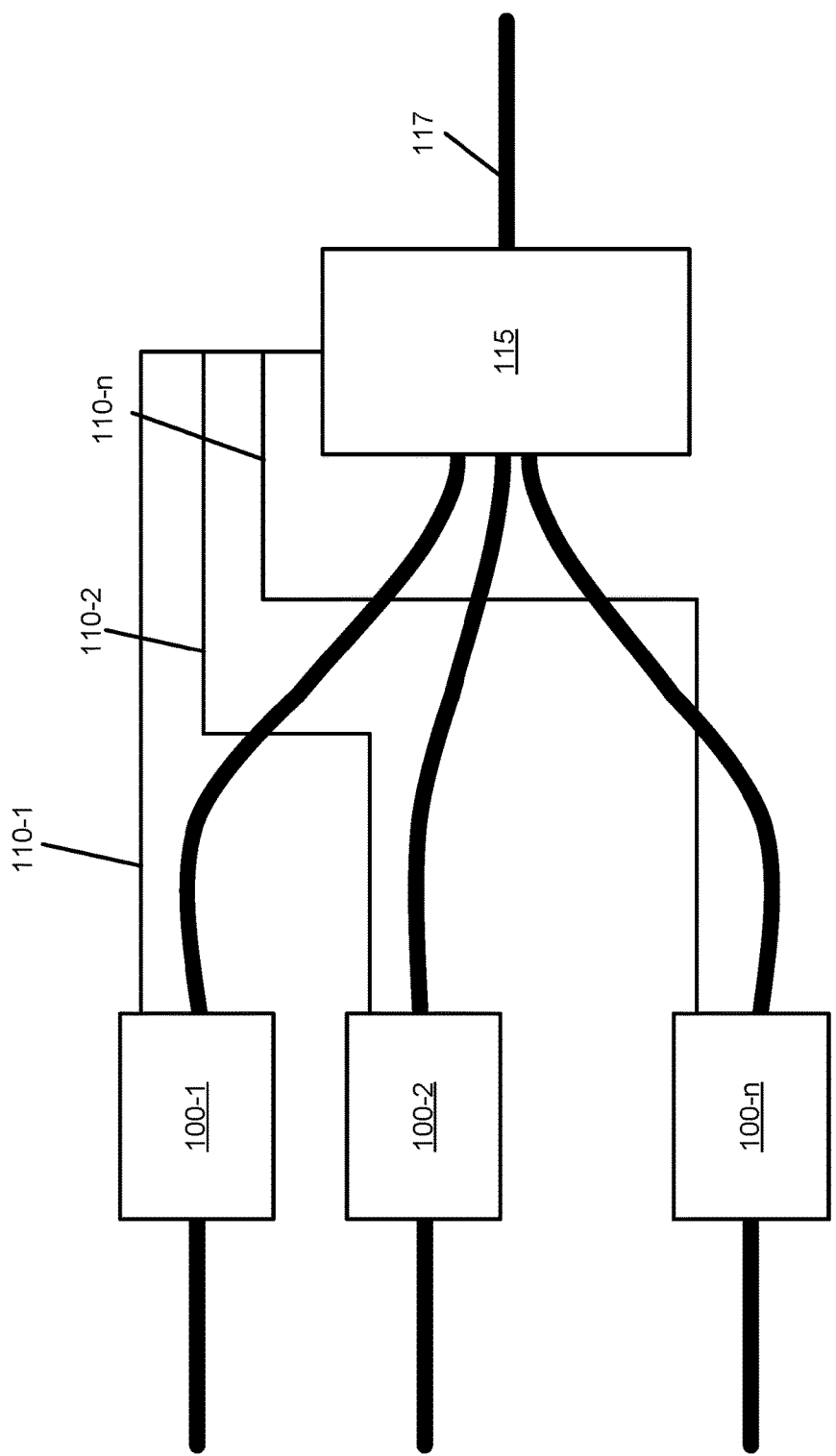

FIG. 1C illustrates how several single photon sources similar to photon source 100 can be multiplexed to increase the reliability of the photon generation process. Such a system is beneficial because of the non-deterministic nature of the conversion between the pump photon and the photon pair in the photon pair generator 103. More specifically, because the photon pair generation process is a quantum mechanical process, it is inherently probabilistic, and thus it is not guaranteed that every pump photon that enters a photon pair generator 103 will result in the generation of a photon pair at the output. In fact, in some instances, the photon pair creation can fail entirely. Thus, to improve the reliability of the photon generation process, several single photon generators 100-1, 100-2, . . . , 100-n, each receiving its own pump photon per generation cycle, can be arranged in parallel and optically (and electrically) coupled to a Nx1 switch 115, as shown. As with the heralded single photon source 100, each single photon generator 100-1, 100-2, . . . , 100-n possesses a dedicated heralding electrical signal line 110-1, 110-2, . . . , 110-n which can provide a heralding signal that informs a downstream circuit element of the successful generation of a photon by that particular photon source. In some embodiments, the heralding electrical signal lines 110-1, 110-2, . . . , 110-n are electrically coupled to the Nx1 switch 115. Nx1 switch 115 includes digital logic that interprets the heralding electrical signals and switches the input port of the Nx1 switch accordingly so as to provide a generated idler photon to the output port 117 of the Nx1 switch 115. Thus, in this case, each photon source 100 includes a superconducting amplifier circuit whose internal arrangement of current sources and parallel superconducting wires provides for enough amplification to drive the logic stage of the Nx1 switch. In other examples, a small signal logic circuit can be employed before the amplifier and Nx1 switch. One of ordinary skill will appreciate that other arrangements are possible without departing from the scope of the present disclosure.

Figure 2A:
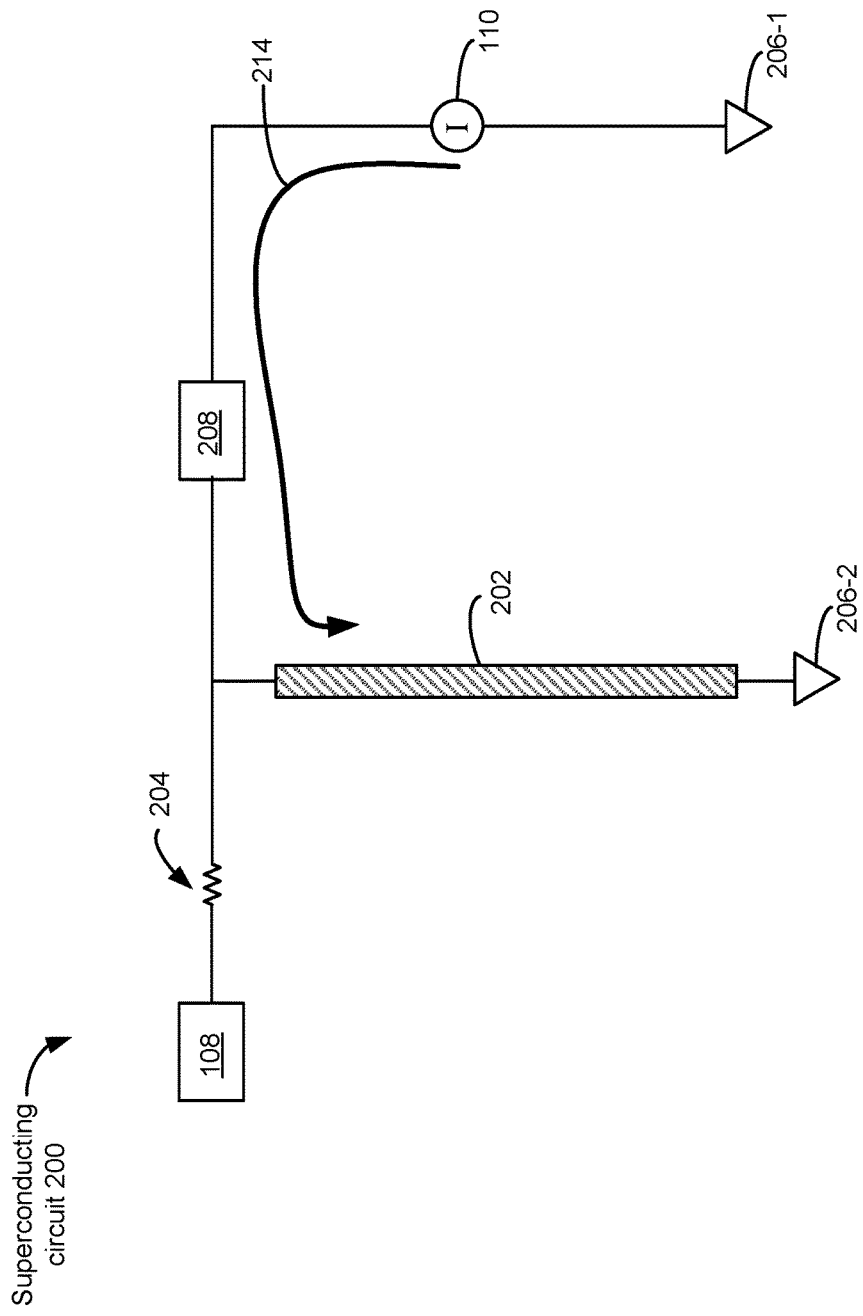
FIGS. 2A-2C are diagrams illustrating a representative operating sequence of a superconducting photodetector circuit in accordance with some embodiments.
Figure 2B:
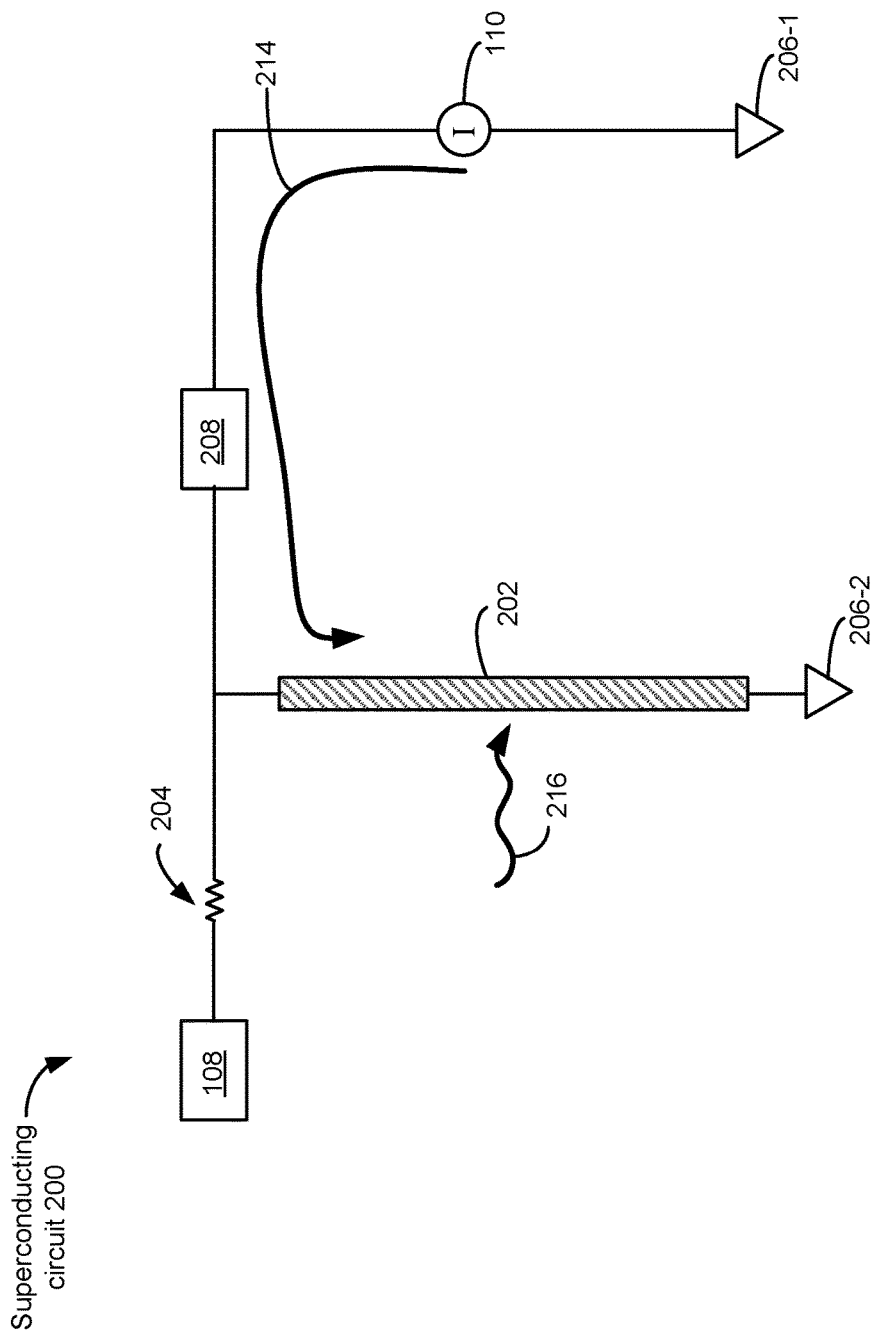
Figure 2C:
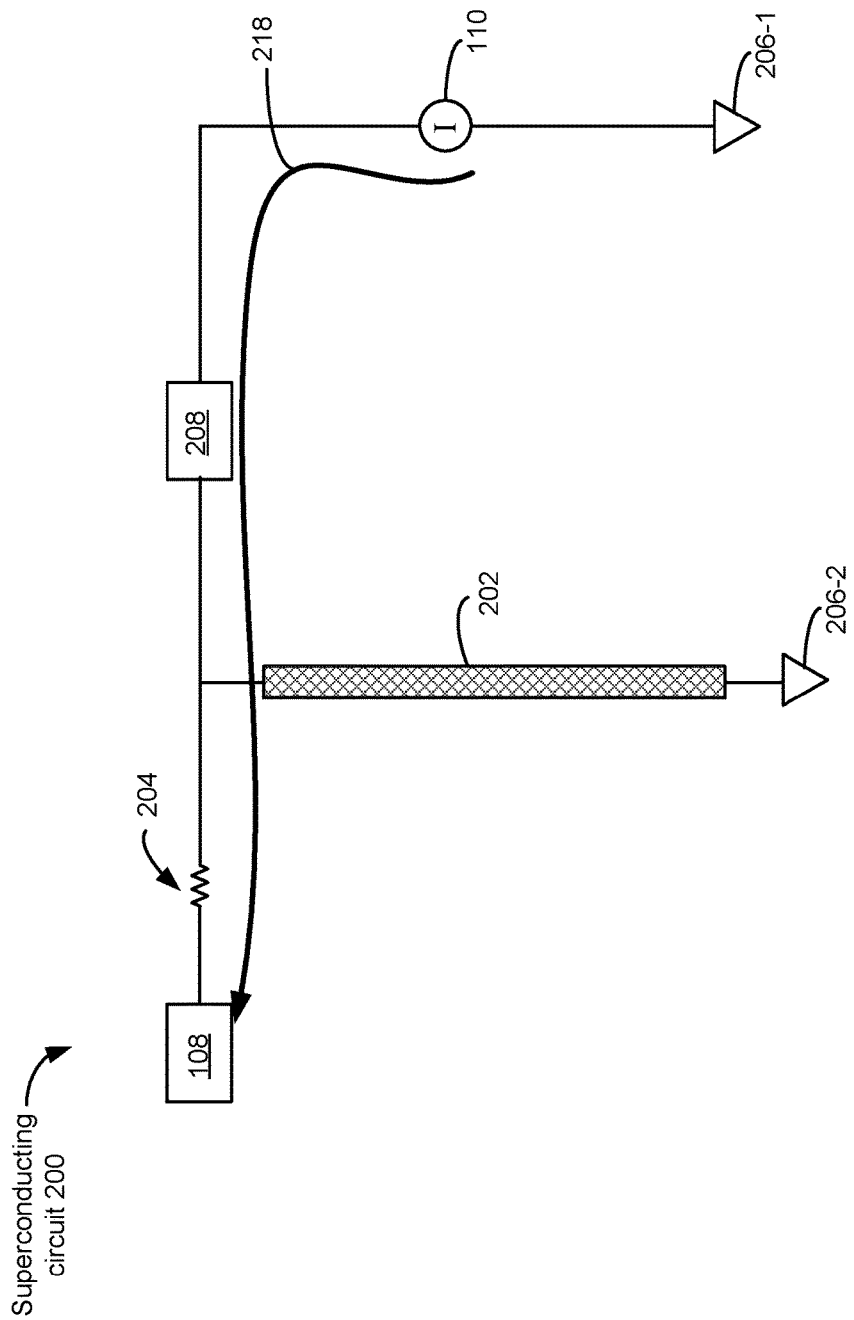

FIGS. 2A-2C are diagrams illustrating a representative operating sequence of a superconducting photodetector circuit 200 in accordance with some embodiments. FIG. 2A shows the superconducting photodetector circuit 200 having a current source 110, a superconducting wire 202, and activation circuitry 208. In some embodiments, the circuit 200 is electrically connected to electrical grounds 206. FIG. 2A also shows a second circuit 108 (e.g., a readout circuit) connected to the superconducting wire 202 (optionally via resistor(s) 204). In some embodiments, the ground 206-1 is electrically connected with the ground 206-2. In some embodiments, the current source 110 is configured to supply a current that is below a maximum superconducting current for the superconducting wire 202 (e.g., 70%, 80%, or 90% of the maximum superconducting current for the superconducting wire 202). In some embodiments, the wire 202 is composed of a niobium alloy (e.g., niobium-germanium). In some embodiments, the wire 202 is configured to maximize sensitivity to single photons (e.g., near-infrared single photons). In some embodiments, the wire 202 has a width less than 50 nanometers (nm), such as between 50 nm and 10 nm. In some embodiments, the wire 202 has a thickness less than 10 nm, such as between 3 nm and 10 nm.

In some embodiments, the resistor(s) 204 have a resistance that is less than a resistance of the superconducting wire 202 while the superconducting wire 202 is in a non-superconducting state. In some embodiments, the resistor(s) 204 include one or more distinct components. In some embodiments, the resistor(s) 204 includes one or more resistances inherent in circuitry 108 and/or the connection between circuitry 108 and the superconducting wire 204.

In some embodiments, the activation circuitry 208 is configured to control the flow of current to the superconducting wire 202. In some embodiments, the activation circuitry 208 is configured to allow flow of current from the current source 110 to the superconducting wire 202 only during predetermined time periods. In some embodiments, the activation circuitry 208 is configured to allow flow of current from the current source 110 to the superconducting wire 202 in response to an enable signal. In some embodiments, the activation circuitry 208 is configured to allow flow of current from the current source 110 to the superconducting wire 202 in response photon(s) incident on one or more components of the activation circuitry 208. In some embodiments, the superconducting photodetector circuit 200 does not include the activation circuitry 208 and the current source 110 is coupled directly to the superconducting wire 202.

FIG. 2A shows the superconducting photodetector circuit 200 at a first time. As shown in FIG. 2A, at the first time the current source 110 supplies a current 214, which flows through the superconducting wire 202. In some embodiments and instances, all of the current 214, or substantially all of the current 214 (e.g., 95%, 98%, or 99%), flows through the superconducting wire 202 due to the wire 202 being in a superconducting state and having zero (or near zero) electrical resistance (e.g., a resistance lower than the resistance of resistor(s) 204). In some embodiments and instances, the superconducting wire 202 is maintained at a temperature below a critical superconducting temperature (e.g., 5 Kelvin) and the current 214 is below a maximum superconducting current threshold for the superconducting wire 202; and thus the superconducting wire 202 operates in a superconducting state (denoted by the hash marks on the wire 202 in FIG. 2A) at the first time.

FIG. 2B shows the superconducting photodetector circuit 200 at a second time. As shown in FIG. 2B, at the second time one or more photons 216 incident the superconducting wire 202. In some instances, when the photon(s) 216 incident the wire 202, they lower the maximum superconducting current threshold for the wire 202 (or a portion thereof). In some embodiments, the current source 110 is configured to supply sufficient current such that a transition of the wire 202 from the superconducting state to a non-superconducting state is triggered in response to the photon(s) 216 contacting the wire 202.

FIG. 2C shows the superconducting photodetector circuit 200 at a third time. As shown in FIG. 2C, at the third time the superconducting wire 202 transitions to the non-superconducting state (denoted by the crosshatching of the wire 202 in FIG. 2C) in response to the current 214 supplied by the current source 110 and the photon(s) 216. The superconducting wire 202 has a non-zero resistance while in the non-superconducting state, therefore current 218 supplied by the current source 110 is redirected through the resistor(s) 204 to the second circuit 108. In some embodiments and instances, all of the current from the current source 110, or substantially all of the current (e.g., 90%, 95%, 98%, or 99%), flows through the resistor(s) 204. This flow of current is due to the resistor(s) 204 having a lower resistance than the wire 202 while the wire is in the non-superconducting state. In some embodiments, the current 218 is readout by the second circuit 108. In some embodiments, the current 218 being supplied to the second circuit 108 provides an indication to a user that photon(s) 216 were detected by the superconducting photodetector circuit 200.

Figure 3A:
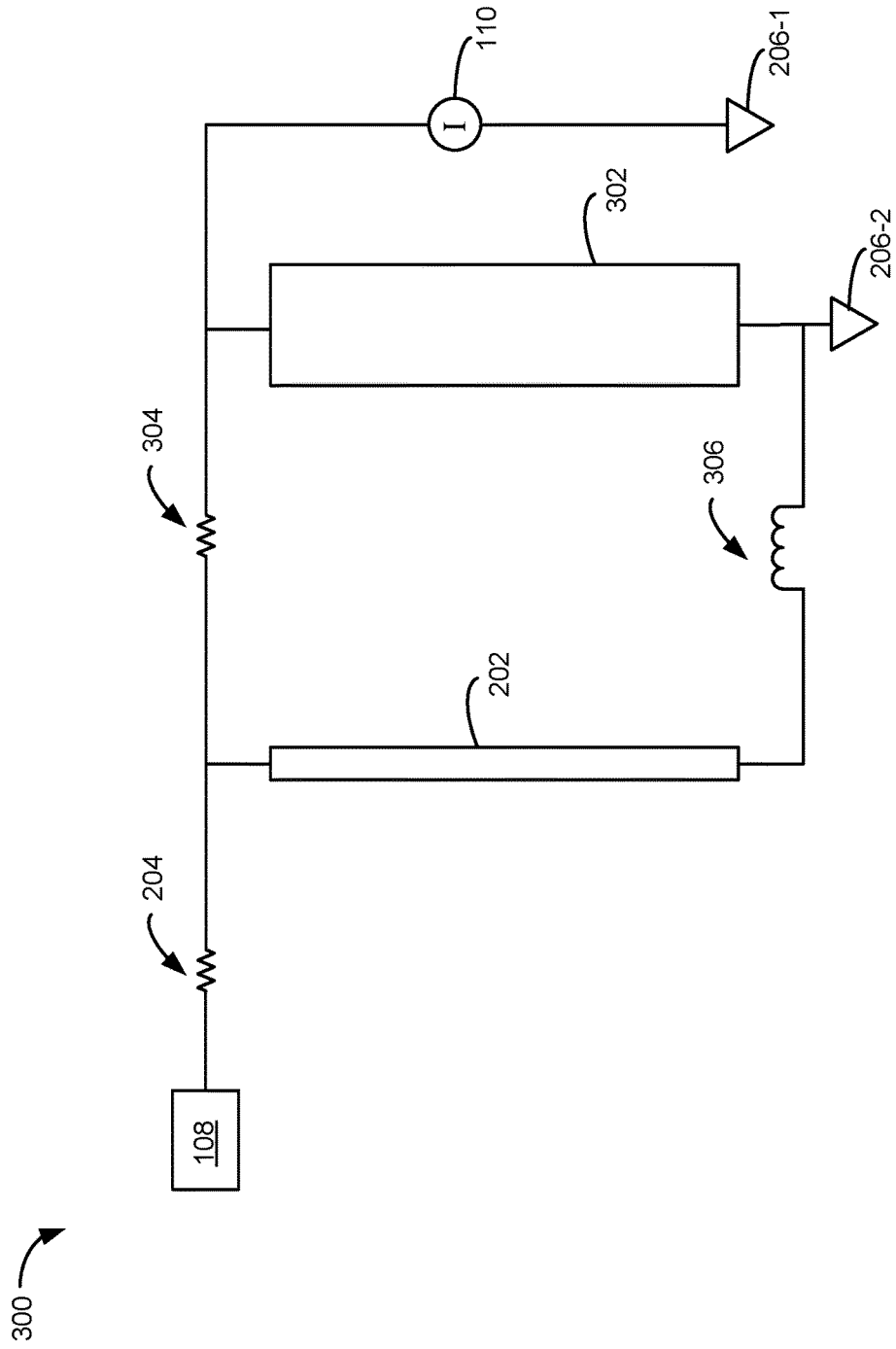
FIGS. 3A-3B are block diagrams illustrating representative superconducting photodetector circuits in accordance with some embodiments.
Figure 3B:
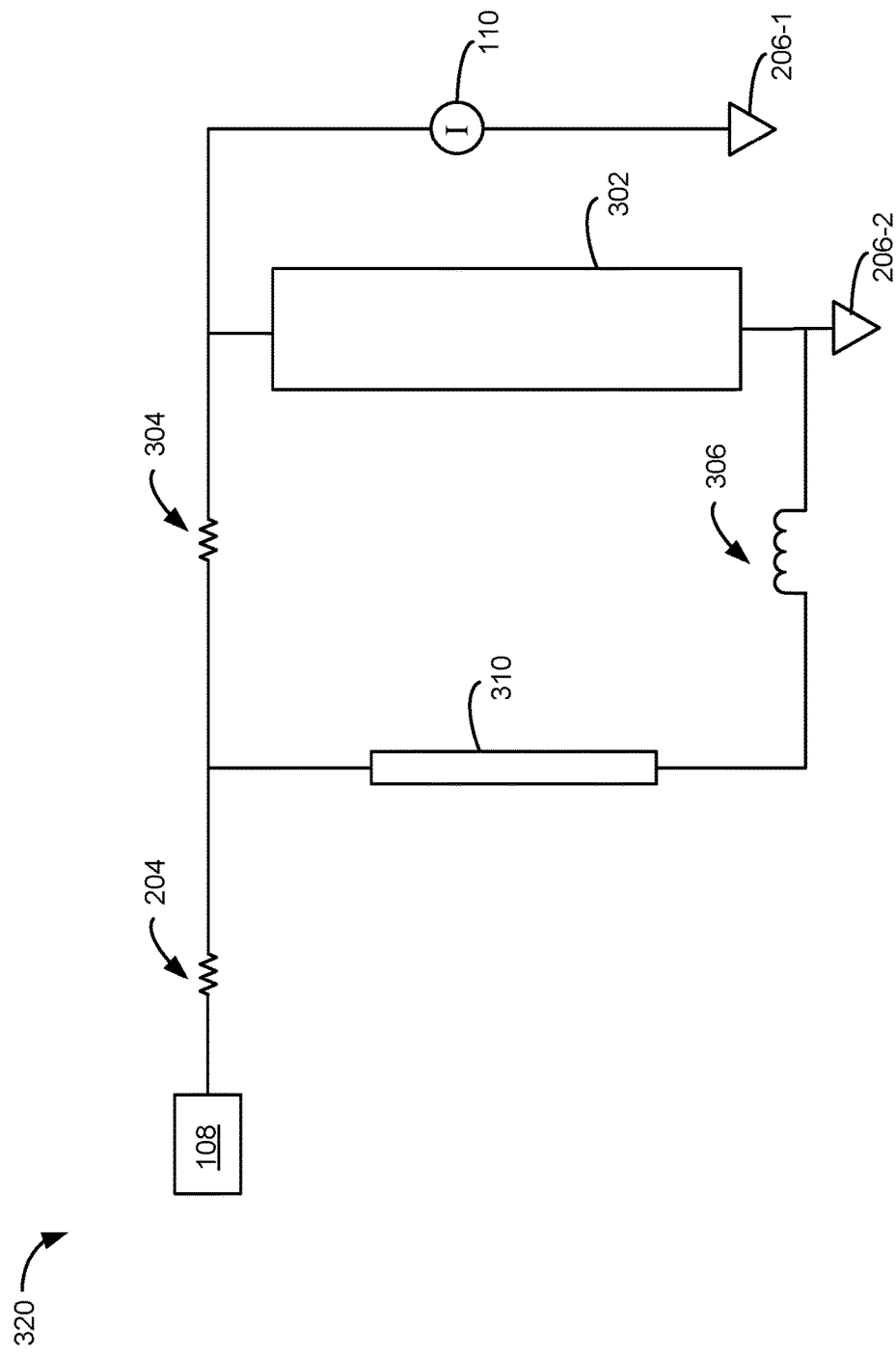

FIGS. 3A-3B are block diagrams illustrating representative superconducting photodetector circuits in accordance with some embodiments. FIG. 3A shows a superconducting photodetector circuit 300 having a current source 110, a first superconducting wire 302 and a second superconducting wire 202, resistor(s) 304, and an optional inductor 306. In some embodiments, the circuit 300 is electrically connected to electrical grounds 206-1 and 206-2. FIG. 3A also shows a second circuit 108 (e.g., a readout circuit) connected to the second superconducting wire 202 (optionally via resistor(s) 204). In some embodiments, the ground 206-1 is electrically connected with the ground 206-2. In some embodiments, the current source 110 is configured to supply a current that is below a threshold superconducting current for the second superconducting wire 202 (e.g., 70%, 80%, or 90% of the threshold superconducting current for the second superconducting wire 202). In some embodiments, the inductor 306 is configured to delay a transition of the first superconducting wire 302 (e.g., by 100 ps, 500 ps, or 2 ns) from a non-superconducting state to a superconducting state.

In some embodiments, the resistor 304 has a resistance that is less than a resistance of the first superconducting wire 302 when the first superconducting wire 302 is in a non-superconducting state. In some embodiments, the resistor 304 has a resistance that is less than a resistance of the second superconducting wire 202 when the second superconducting wire 202 is in a non-superconducting state. In some embodiments, the resistor 304 has a resistance that is less than a resistance of the first superconducting wire 302 when the first superconducting wire 302 is in a non-superconducting state and a resistance of the second superconducting wire 202 when the second superconducting wire 202 is in a non-superconducting state. In some embodiments, the resistor 204 has a resistance that is less than a resistance of the first superconducting wire 302 when the first superconducting wire 302 is in a non-superconducting state. In some embodiments, the resistor 204 has a resistance that is less than a resistance of the second superconducting wire 202 when the second superconducting wire 202 is in a non-superconducting state. In some embodiments, the resistor 204 has a resistance that is less than a resistance of the first superconducting wire 302 when the first superconducting wire 302 is in a non-superconducting state and a resistance of the second superconducting wire 202 when the second superconducting wire 202 is in a non-superconducting state. In some embodiments, the resistor 304 and/or the resistor 204 includes one or more distinct components. In some embodiments, the resistor 204 includes one or more resistances inherent in the circuitry 108 and/or the connection between circuitry 108 and the second superconducting wire 202.

In some embodiments, the first wire 302 and the second wire 202 have a same thickness (e.g., 10 nm). In some embodiments, the first wire 302 and the second wire 202 have different thicknesses. In some embodiments, the first wire 302 and the second wire 202 are composed of a same material (e.g., niobium or niobium alloy). In some embodiments, the first wire 302 and the second wire 202 are composed of different materials. In some embodiments (not shown), the first wire 302 and the second wire 202 have a same width (e.g., 100 nm). In some embodiments, the first wire 302 and the second wire 202 have different widths.

FIG. 3B shows a superconducting photodetector circuit 320 that is similar to the superconducting photodetector circuit 300 in FIG. 3A, except that the second superconducting wire 310 in FIG. 3B has a shorter length than the first superconducting wire 302. In various embodiments, the thickness, width, and length of the first wire 302 and the second wire 310 are varied (e.g., independently varied) to achieve desired superconducting current thresholds for each wire.

Figure 4A:
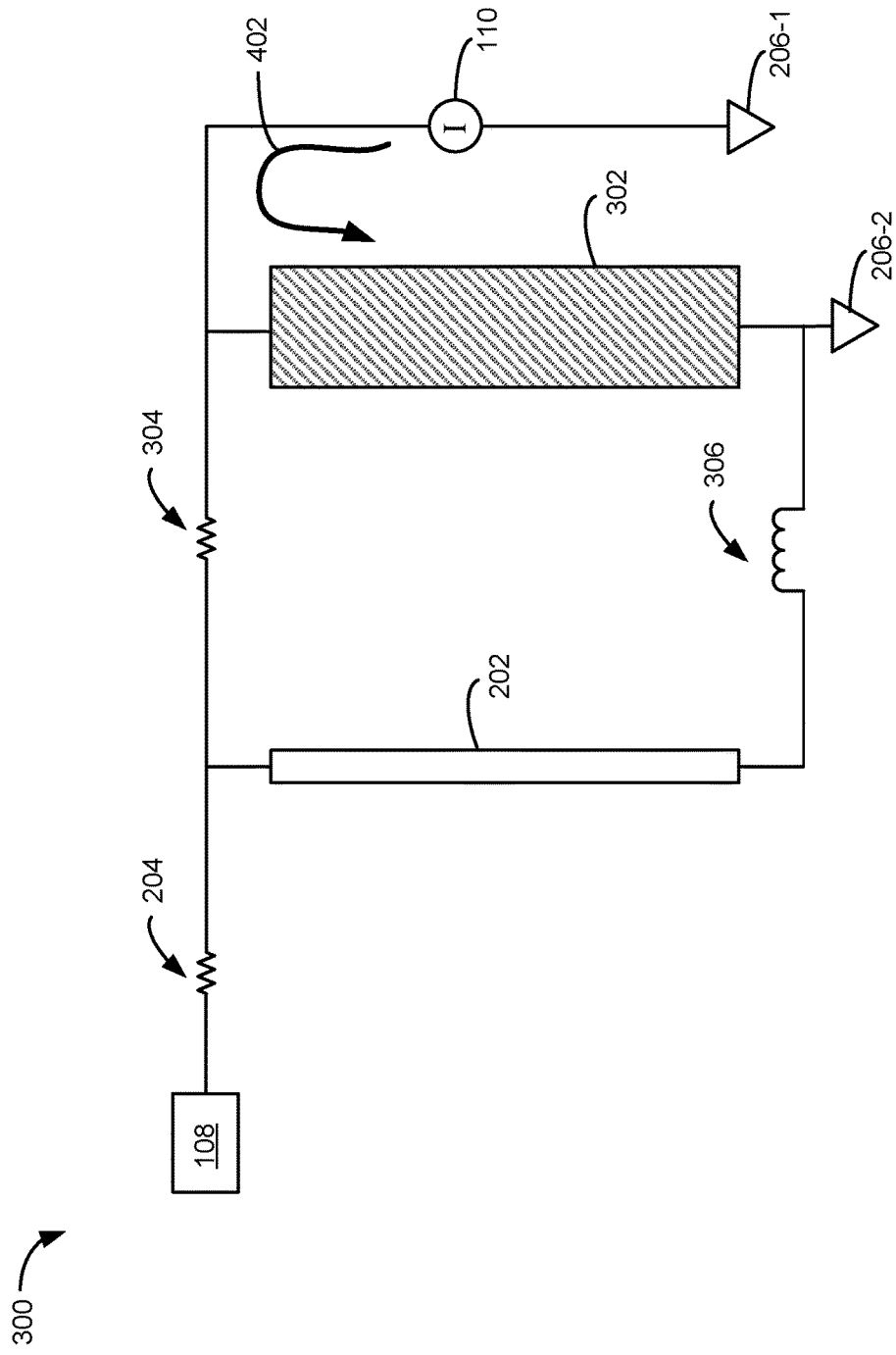
FIGS. 4A-4F are diagrams illustrating a representative operating sequence of the superconducting photodetector circuit of FIG. 3A in accordance with some embodiments.

FIGS. 4A-4F are diagrams illustrating a representative operating sequence of the superconducting photodetector circuit 300 of FIG. 3A in accordance with some embodiments. FIG. 4A shows the superconducting photodetector circuit 300 at a first time. As shown in FIG. 4A, at the first time the current source 110 supplies a current 402, which flows through the first superconducting wire 302. FIG. 4A also shows the second superconducting wire 202 in an off state (e.g., since no current is supplied to the second wire 202 at the first time). In some embodiments and instances, all of the current 402, or substantially all of the current 402 (e.g., 95%, 98%, or 99%), flows through the first superconducting wire 302 due to the wire 302 being in a superconducting state and having zero electrical resistance (e.g., a resistance lower than the resistance of resistor 304). In some embodiments and instances, the current 402 is below a superconducting current threshold for the first superconducting wire 302, and thus the first superconducting wire 302 operates in a superconducting state (denoted by the hash marks on the wire 302 in FIG. 4A) at the first time.

Figure 4B:
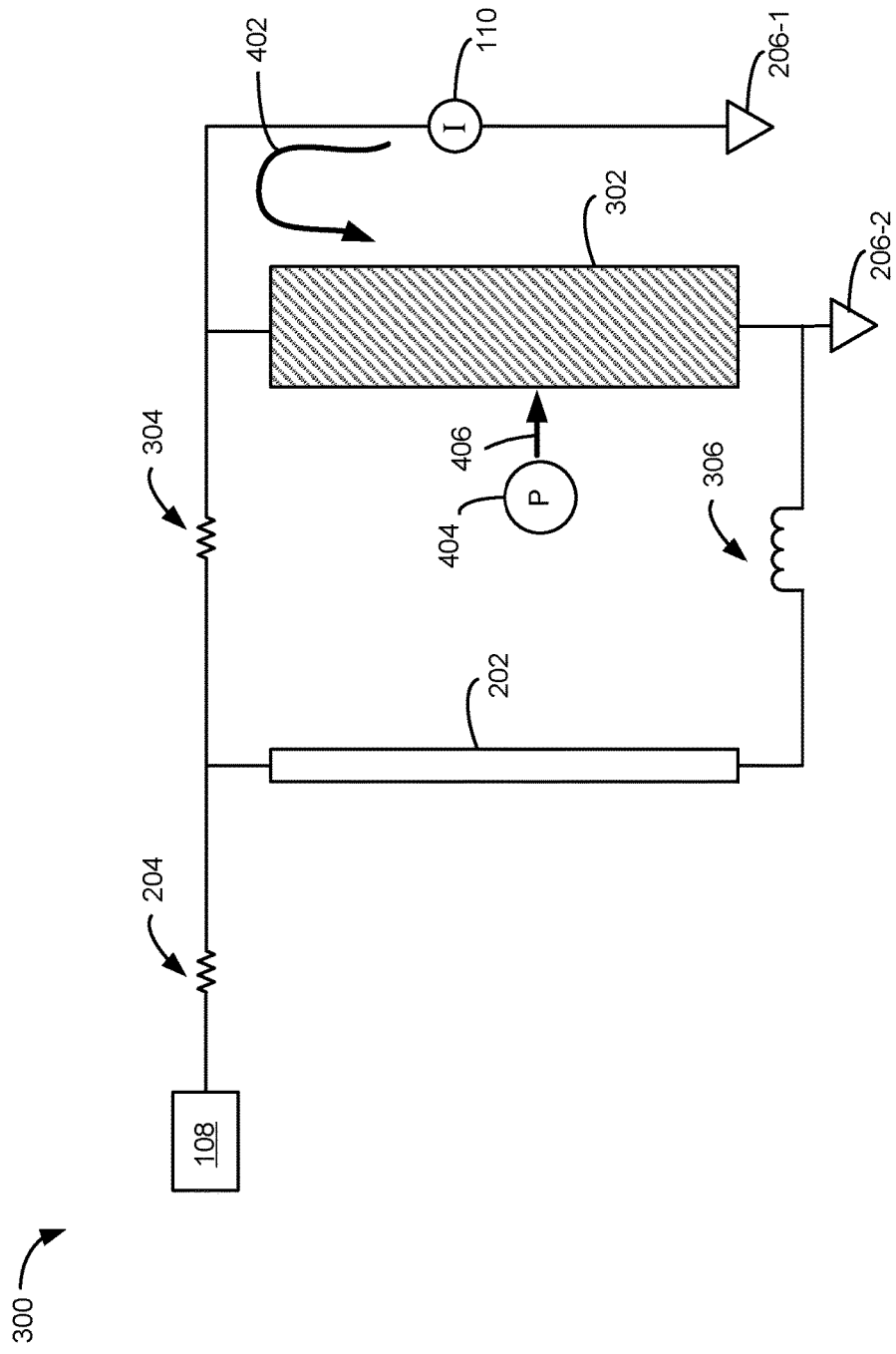

FIG. 4B shows the superconducting photodetector circuit 300 at a second time. As shown in FIG. 4B, at the second time a photon source 404 (sometimes also called a photon pump) supplies the first superconducting wire 302 with one or more photons 406 (e.g., in some configurations, or in some circumstances, a pulse including at least 100 photons). In some instances, when the photons 406 are incident on the wire 302, the photons break Cooper pairs and thereby reduce the maximum superconducting current density in the wire 302 and also can create a hotspot in the wire. In some embodiments, the photon source 404 is configured to supply sufficient energy to the wire 302 (e.g., by way of multiple photons or a single relatively high energy photon) so as to trigger a transition of the first wire 302 from the superconducting state to a non-superconducting state. In some embodiments, due to physical separation of wires 302 and 202, and placement of photon source 404 proximate first wire 302, photons 406 are not received by wire 202.

In some embodiments (not shown), the photon source 404 is replaced by a current source that supplies a current to the first superconducting wire 302. In some embodiments, the current source is configured to supply a current that, when combined with the current 402 from the current source 110, exceeds the superconducting current threshold for the first wire 302.

Figure 4C:
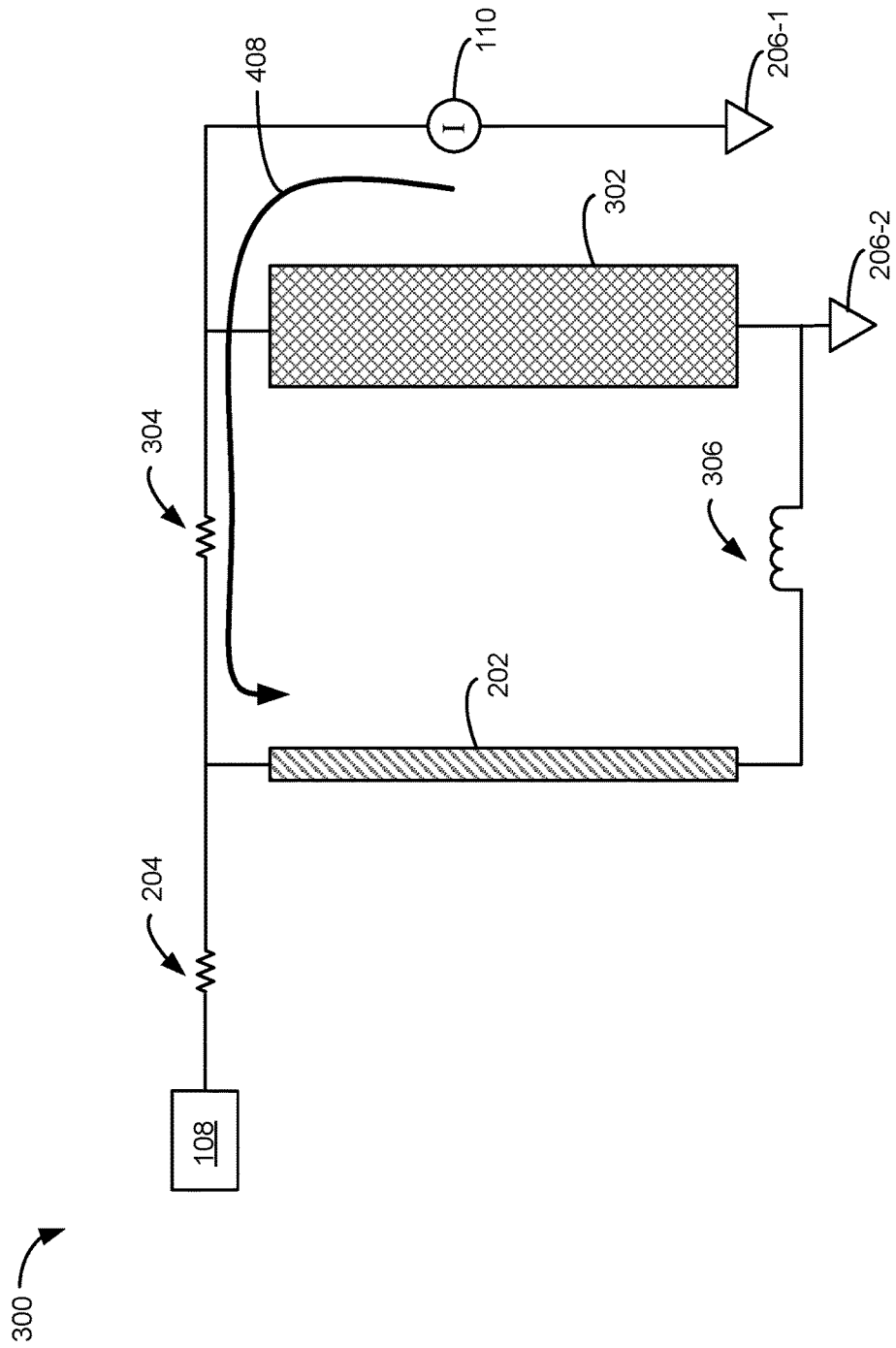

FIG. 4C shows the superconducting photodetector circuit 100 at a third time. As shown in FIG. 4C, at the third time the first superconducting wire 302 transitions to the non-superconducting state (denoted by the crosshatching of the wire 302 in FIG. 4C) in response to the current 402 supplied by the current source 110 and the photons 406 from the photon source 404. The first superconducting wire 302 has a non-zero resistance while in the non-superconducting state, therefore current 408 supplied by the current source 110 is redirected through the resistor 304 and the second superconducting wire 202. In some embodiments and instances, all of the current from the current source 110, or substantially all of the current (e.g., 95%, 98%, or 99%), flows through the resistor 304 and the second superconducting wire 202. This flow of current is due to the resistor 304 and the second wire 202 having a lower resistance than each of the first wire 302 and the resistor 204. In some embodiments and instances, the current 408 is below a superconducting current threshold for the second superconducting wire 202, and thus the second superconducting wire 202 operates in a superconducting state (denoted by the hash marks on the wire 202 in FIG. 4C) at the third time.

Figure 4D:
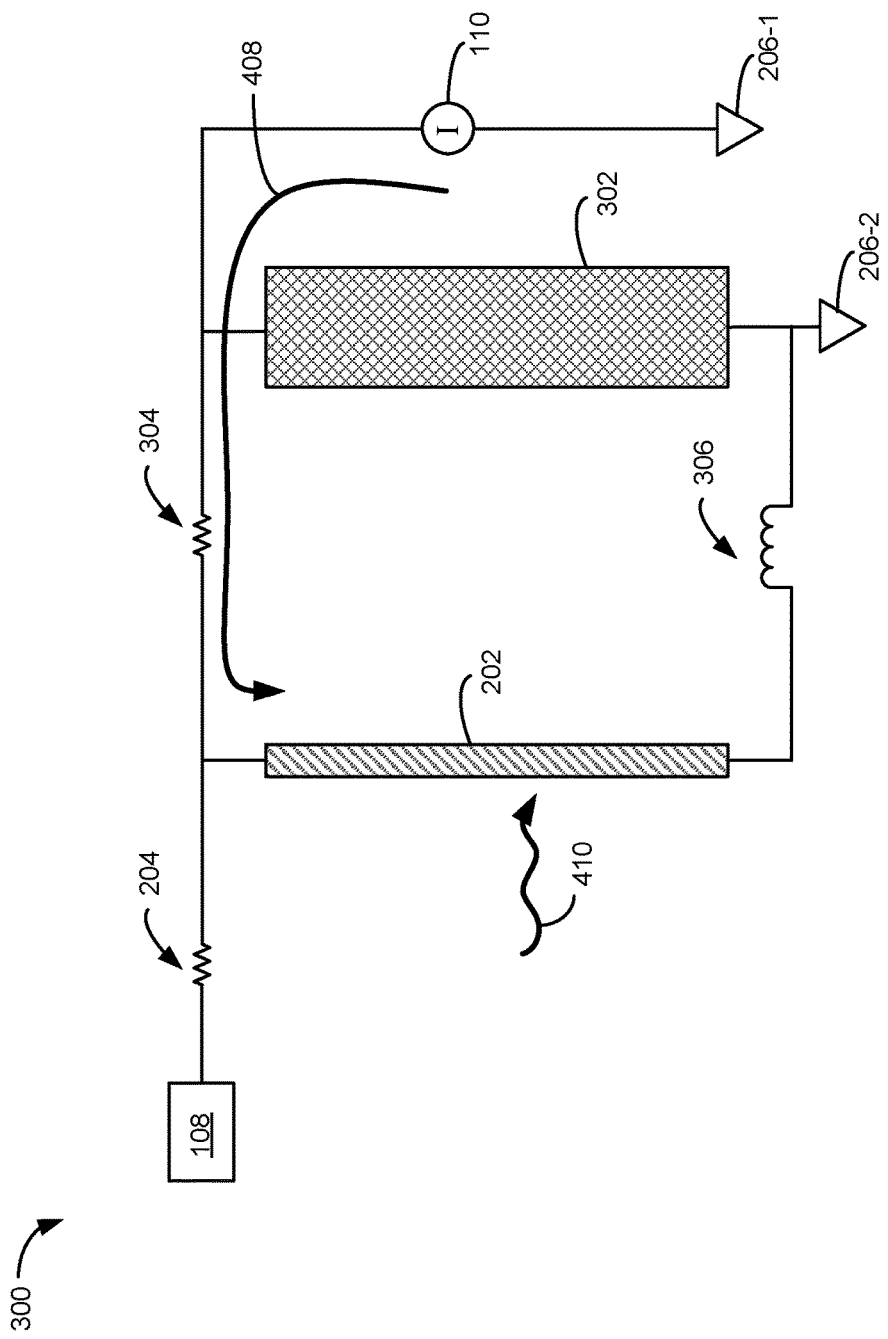

FIG. 4D shows the superconducting photodetector circuit 300 at a fourth time. As shown in FIG. 4D, at the fourth time one or more photons 410 are incident on the second superconducting wire 202. In some instances, when the photon(s) 410 incident the wire 202, they lower the superconducting current threshold for the wire 202 (or a portion thereof). In some embodiments, the current source 110 is configured to supply sufficient current such that a transition of the second wire 202 from the superconducting state to a non-superconducting state is triggered when the photon(s) 410 incident the wire. In some instances, when the photons 410 are incident on the wire 202, the photons break Cooper pairs and thereby lower the superconducting current threshold for the wire 202, and/or reduce the maximum superconducting current density in the wire 202.

Figure 4E:
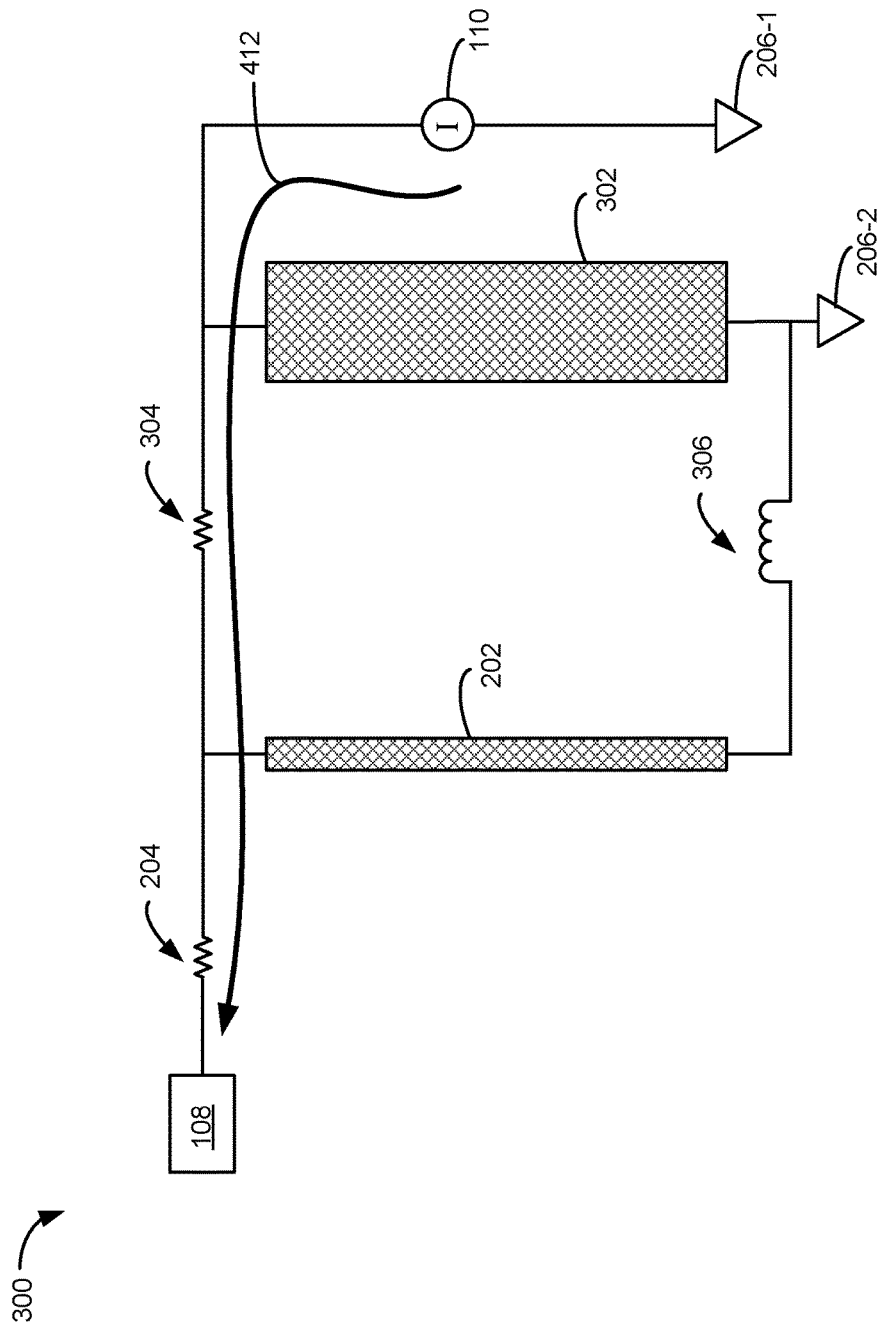

FIG. 4E shows the superconducting photodetector circuit 300 at a fifth time. As shown in FIG. 4E, at the fifth time the second superconducting wire 202 transitions to the non-superconducting state (denoted by the crosshatching of the wire 202 in FIG. 4E) in response to the current 408 supplied by the current source 110 and the photon(s) 410. The second superconducting wire 202 has a non-zero resistance while in the non-superconducting state, therefore current 412 supplied by the current source 110 is redirected through the resistor 204 to the second circuit 108. In some embodiments and instances, all of the current from the current source 110, or substantially all of the current (e.g., 95%, 98%, or 99%), flows through the resistor 204. This flow of current is due to the resistor 204 having a lower resistance than the second wire 202, and the resistors 204 and 304 having a lower resistance than the first wire 302. In some embodiments, the current 412 is readout by the second circuit 108. In some embodiments, the current 412 being supplied to the second circuit 108 provides an indication that photon(s) 410 were detected by the superconducting photodetector circuit 300.

Figure 4F:
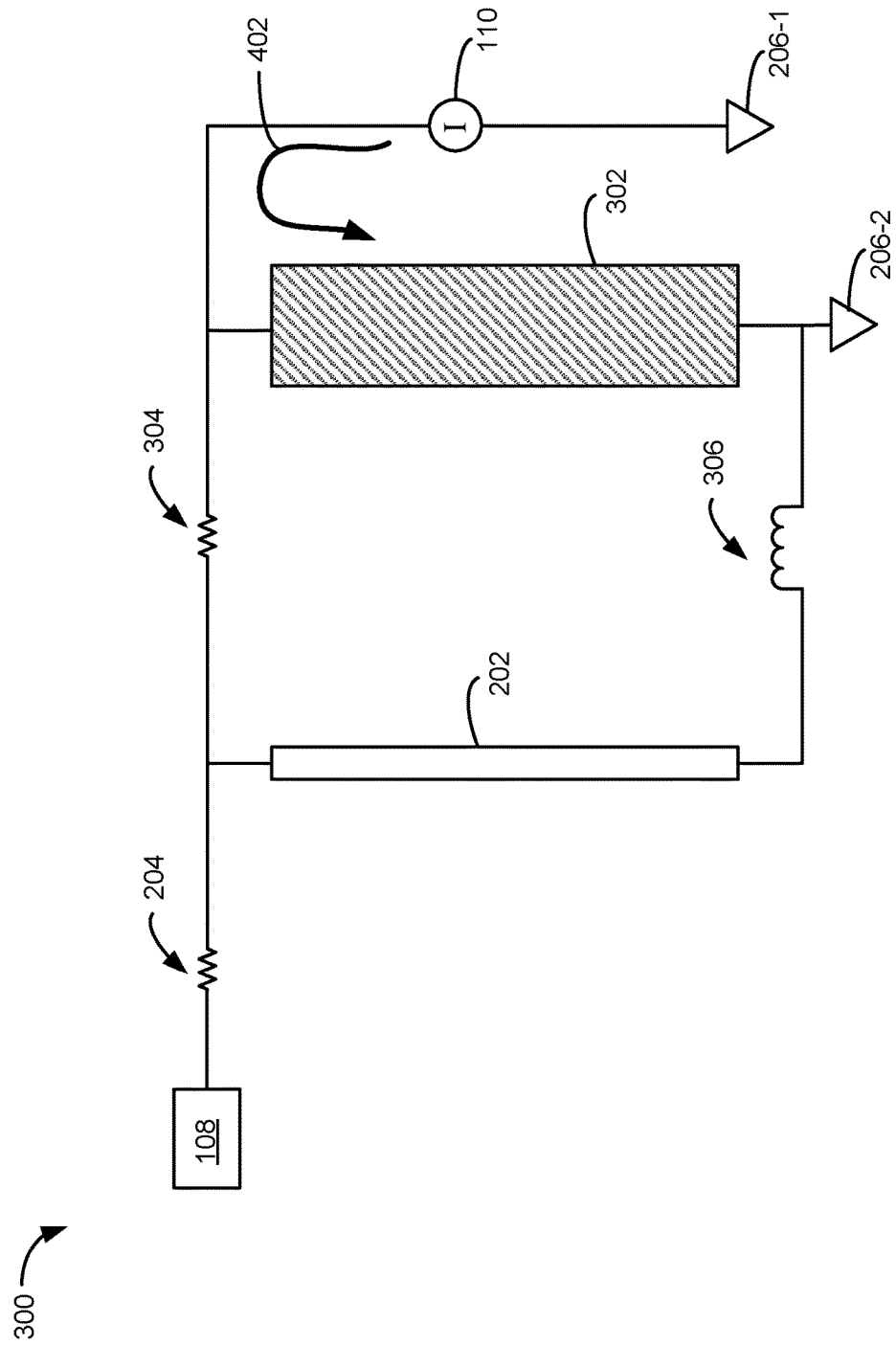

FIG. 4F shows the superconducting photodetector circuit 300 at a sixth time. As shown in FIG. 4F, at the sixth time the first wire 302 has transitioned back to the superconducting state and the second wire 202 has transitioned back to the off state. FIG. 4F also shows the current source 110 supplying the current 402 to the first superconducting wire 302. In some embodiments, the transition of the first wire 302 back to the superconducting state is based on (e.g., a rate at which the transition occurs is controlled by) the inductance of the inductor 306. In some embodiments, the inductor 306 is configured such that the transition of the first wire 302 occurs between 200 picoseconds (ps) and 3 nanoseconds (ns) after the transition of the first wire 302 from the superconducting state to the non-superconducting state (e.g., shown in FIG. 4C).

Figure 5:
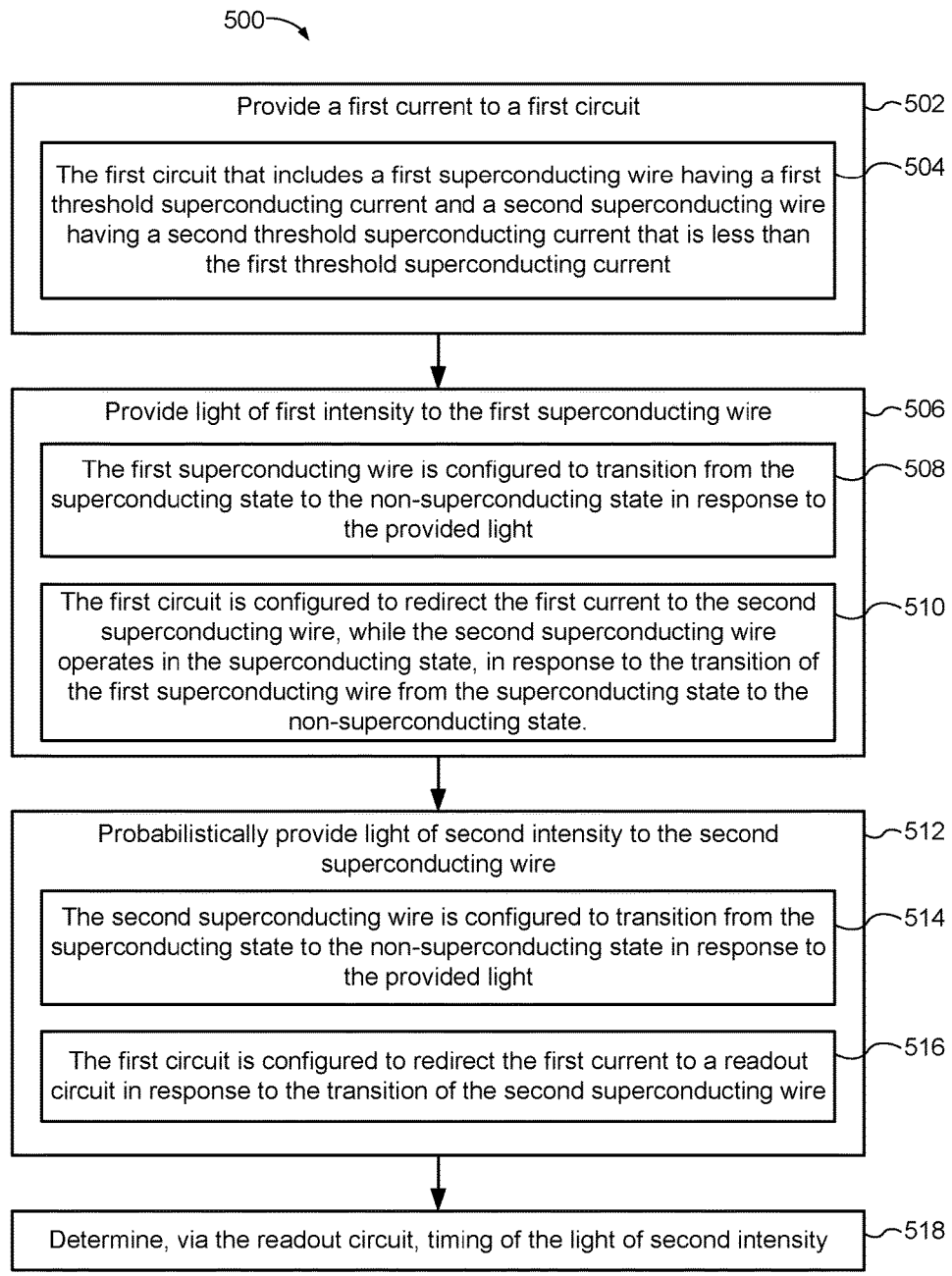
FIG. 5 is a flow diagram illustrating a representative method of detecting light in accordance with some embodiments.

FIG. 5 is a flow diagram illustrating a method 500 of detecting light in accordance with some embodiments. In some embodiments, the method 500 is performed by a photon detector system that includes a superconducting circuit (e.g., the circuit 200) and a plurality of photon sources (e.g., the photon source 404).

The photon detector system provides (502) a first current (e.g., the current 402, FIG. 4A) to a first circuit. In some embodiments, the first circuit includes (504) a first superconducting wire (e.g., the wire 302, FIG. 4A) having a first threshold superconducting current and a second superconducting wire (e.g., the wire 202, FIG. 4A) having a second threshold superconducting current that is less than the first threshold superconducting current. In other embodiments, the first and second threshold currents can be equal and in yet other embodiments, the first threshold current can be less than the second threshold current. In some embodiments, the first circuit further includes a resistor (e.g., the resistor 304, FIG. 4A) with a first end of the resistor coupled to a first end of the first superconducting wire and a second end of the resistor, opposite to the first end of the resistor, coupled to a first end of the second superconducting wire. In some embodiments, the first current is less than the second threshold superconducting current, and therefore the first superconducting wire is able to operate in a superconducting state while the first current flows through the first circuit. In some embodiments, the first current can be less than the first threshold superconducting current.

The photon detector system provides (506) light of a first intensity and/or a first energy to the first superconducting wire (e.g., via the photon source 404 as shown in FIG. 2B). The first superconducting wire is configured to (508) transition from the superconducting state to the non-superconducting state in response to the provided light. The first circuit is configured to (510) redirect the first current to the second superconducting wire, while the second superconducting wire operates (e.g., continues to operate) in the superconducting state, in response to the transition of the first superconducting wire from superconducting state to the non-superconducting state. In some embodiments, the light of first intensity causes the first superconducting wire to transition from the superconducting state to a non-superconducting state and causes redirection of the first current toward the second superconducting wire while the second superconducting wire operates (e.g., continues to operate) in a superconducting state. As already noted above, the first current is less than the second threshold superconducting current, and therefore redirection of the first current toward the second superconducting wire does not cause the second superconducting wire to transition to the non-superconducting state.

The photon detector system receives (512) light of second intensity and/or a second energy at the second superconducting wire (e.g., as shown in FIG. 4D). In some embodiments, this light is generated probabilistically via a single photon source, a photon pair source or any other light source. In some embodiments, the photons that make up the light of the second intensity can be conditionally provided as a result of an upstream quantum computing operation. The second superconducting wire is configured to (514) transition from the superconducting state to the non-superconducting state in response to the provided light. The first circuit is configured to (516) redirect the first current to a readout circuit (e.g., circuit 108) in response to the transition of the second superconducting wire to the non-superconducting state. In some embodiments, the light of second intensity causes the second superconducting wire to transition from the superconducting state to a non-superconducting state and furthermore causes redirection of the first current toward a second circuit that is coupled to the first end of the second superconducting wire. It is noted that the first current is redirected to the second circuit because both the first superconducting wire and the second superconducting wire are in a non-superconducting state.

The photon detector system determines (518), via the readout circuit, timing of the light of second intensity, i.e., the readout circuit can not only perform a binary detector measurement of the photon (photon detected or photon not detected) but the readout circuit can also associate the photon generation event with a system clock cycle or time. For example, the photon detector system determines whether receiving the light of second intensity at a given time resulted in light being received at the second superconducting wire. In some embodiments, current flowing through the second circuit (e.g., the current 412 in FIG. 4E) is measured to determine whether the light of second intensity has been received at the second superconducting wire.

In accordance with some embodiments, a method includes operating a single photon detection circuit in a non-detecting state, including: operating a first superconducting wire (e.g., wire 202, FIG. 3A) in an off state; and operating a second superconducting wire (e.g., wire 302, FIG. 3A) in a superconducting state by directing a current through the second superconducting wire. The method also includes, while operating the circuit in the non-detecting state, transitioning to operating in a detecting state, including redirecting the current through the first superconducting wire. Operating in the detecting state includes: operating the first superconducting wire in a superconducting state; operating the second superconducting wire in a non-superconducting state; while operating the circuit in the detecting state, receiving the single photon at the first superconducting wire; and in response to receiving the single photon, redirecting the current to a circuit coupled to the first superconducting wire.

In some embodiments, transitioning to operating in the detecting state includes supplying an amount of current to the second superconducting wire that exceeds a threshold superconducting current for the second superconducting wire. In some embodiments, at least a portion of the current supplied to the second superconducting wire is received via a plurality of photons contacting the second superconducting wire.

Materials and Fabrication

It can be difficult and costly to cool circuits and device from room temperature to temperatures near absolute zero. In addition, it also can be difficult and costly to maintain these devices at such low temperatures and often the power required to do so is a limiting factor in the scalability of any systems that seek to deploy large numbers of devices. Therefore, it is desirable to have device operating temperatures that are as high as possible while still preserving the required specification of the device itself (e.g., low dark counts in the case of photon detectors). To this end, it is desirable to use superconducting materials that have threshold temperatures that are some multiple (2×, 3×, 4×, etc.) of the operating temperature (e.g., to keep dark counts low) and employ materials having threshold temperatures that are as high as possible in absolute temperature to minimize the energy cost of cryogenic cooling.

Figure 6:
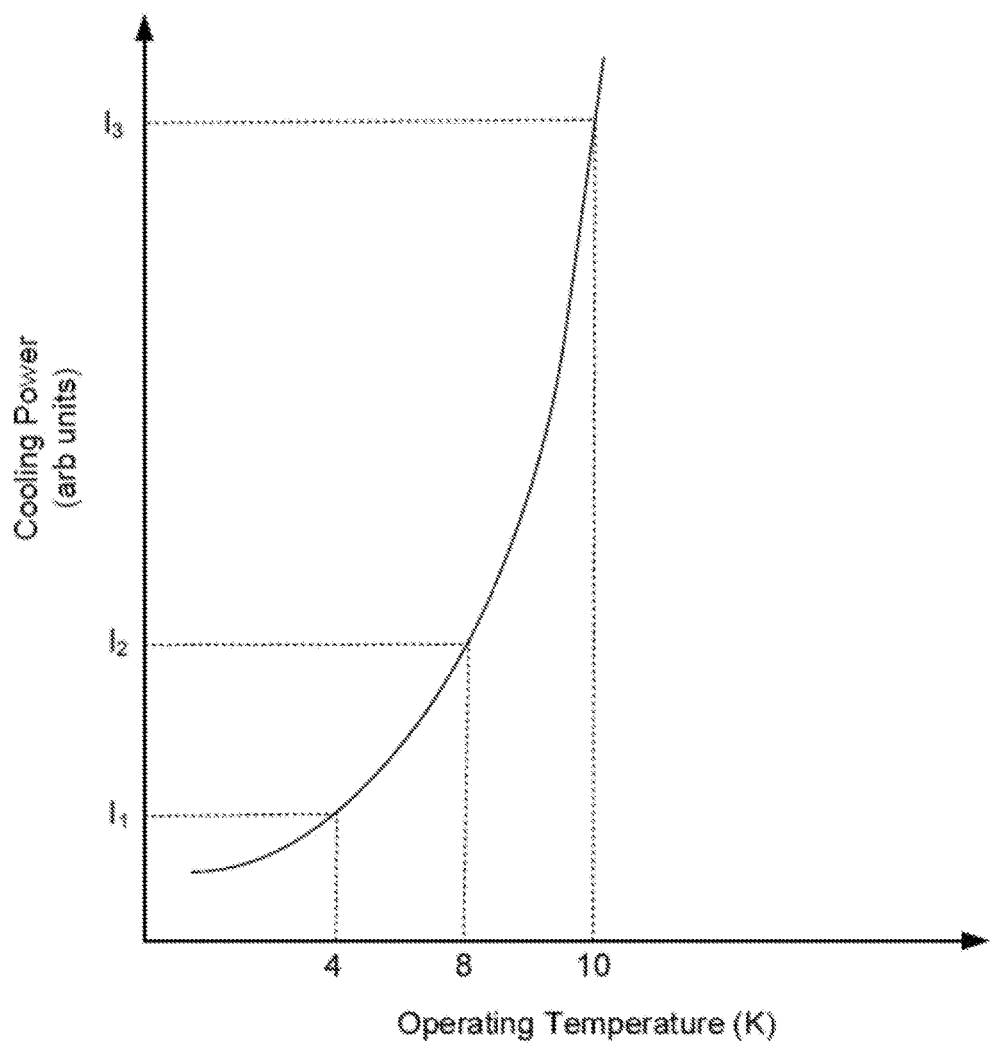
FIG. 6 is a prophetic diagram illustrating the temperature dependence of the cooling power of a cryostat in accordance with some embodiments.

With respect to the challenges of cryogenic cooling, superconducting devices that have a relatively high operating temperature can require vastly less energy to operate when compared to lower temperature devices. FIG. 6 is a prophetic diagram shown here to illustrate the concept of temperature dependence of the cooling power of a cryostat that employs a cold fluid, e.g., liquid helium or the like. In some embodiments, one or more superconducting electronic devices are cryogenically cooled during operation by housing them within such a cryostat (or other similar cryogenic cooling system). In the prophetic example shown in FIG. 6, the cooling power of the cryostat at 10 K (indicated by $I_3$) is approximately 8 times the cooling power at 4 K (indicated by $I_1$). In view of the dependence of the cryostat's cooling power with increasing operating temperature, it is desirable to push superconducting device threshold temperatures (also referred to as the superconducting "critical temperature") as high as possible. For some devices, it becomes desirable to utilize a superconducting material with a threshold temperature above 6 Kelvin, more preferably above 16 Kelvin, above 24 Kelvin, above 32 Kelvin, above 40 Kelvin, etc., in order to achieve operating temperatures of 4 Kelvin, 6 Kelvin, 8 Kelvin, 10 Kelvin, etc. The ratio of the operating temperature to the threshold temperature will vary according to the required specification of the device as would be appreciated by one of ordinary skill in the art having the benefit of this disclosure.

One reasonably direct way to increase the superconducting threshold temperature of a device is to use a superconducting material with the highest bulk threshold temperature possible. A number of such materials exists, often referred to as "high temperature" superconductors. For example, copper oxide superconductors, cuprate superconductors, and the like have bulk threshold temperatures in the range of 90-135 K.

In accordance with one or more embodiments, devices employ thin films for the superconducting elements, and the threshold temperatures in these thin films are reduced by as much as 80 to 90 percent as compared to threshold temperatures in the bulk materials. Thus, it can be even more difficult to employ thin film devices while also operating in a range of 4 K or greater. Employing one or more of the high temperature superconducting materials is one possible solution, but high quality thin films are difficult to fabricate from these materials due to material properties and manufacturing complexity.

Figure 7A:
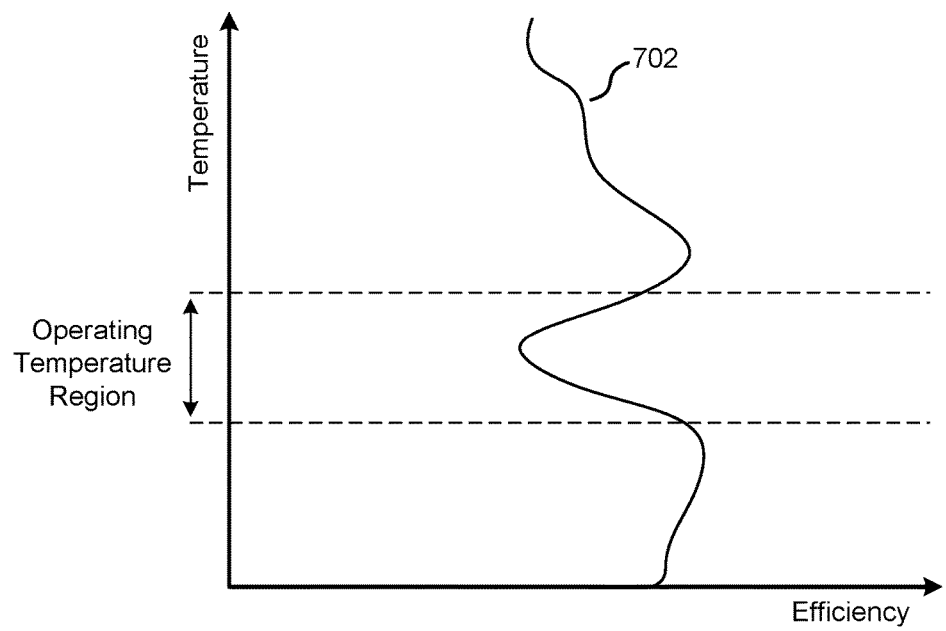
FIGS. 7A-7B illustrate example temperature-efficiency curves for superconducting materials in accordance with some embodiments.

The high-temperature superconductors have another disadvantage when employed as photon detectors due to the fact that their photodetection efficiency can exhibit a non-trivial dependence on temperature, as shown in prophetic curve 702 of FIG. 7A. Consequently, the efficiency of any detector based on a high temperature superconducting material may vary dramatically within an operating temperature region of the device. At best, such non-trivial temperature dependence can lead to the need for costly and time-consuming device specific (detector-by-detector) temperature calibration. At worst, such temperature dependence can completely eliminate such devices from applications that require tight tolerances on the device efficiency, e.g., as is the case for devices employed within quantum computers.

Figure 7B:
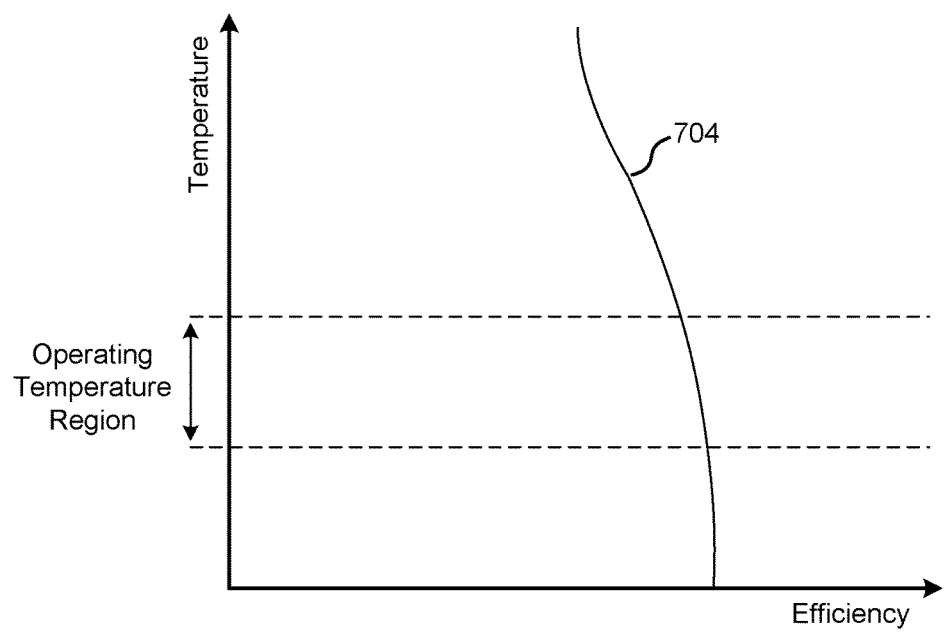

Other "non-high temperature" superconductor materials such as NbN have bulk threshold temperatures around 16 K with the majority of other Nb based compounds exhibiting similarly low threshold temperatures. In accordance with some embodiments, niobium-germanium (also referred to as niobium-germanide, NbGe or $Nb_xGe$) superconducting films are advantageous because they are atypical of the family of Nb compounds due to the fact that they optionally have threshold temperatures in the range of 20 K to 26 K. Furthermore, in some embodiments, detectors based on NbGe have detector efficiencies that have an improved temperature dependence as compared to the high-temperature superconductors. As shown in the prophetic curve of FIG. 7B, such NbGe devices exhibit a weaker dependence of detector efficiency on temperature. More specifically, temperature-efficiency curve 704, for NbGe, has a much smaller variance within the operating temperature region as compared to curve 702, for a high-temperature superconductor such as YBCO. Therefore, as discussed above, in some embodiments (such as those involving photon detection), the superconducting material represented by curve 704 (e.g., niobium-germanium) is preferable to the superconducting material represented by curve 702 (e.g., yttrium barium copper oxide (YBCO) or magnesium diboride ($MgB_2$)), even though naively one might assume that the high-temperature materials would be superior based on operating temperature considerations alone.

Furthermore, in some embodiments, detectors based on NbGe have detector efficiencies that have an improved temperature dependence as compared to superconductors with higher transition temperatures. Unlike some high-temperature superconductors, the efficiency and superconducting properties of NbGe are essentially isotropic, i.e. independent of the direction of the final superconducting device relative to the crystal orientation of the substrate material. The isotropic nature of NbGe simplifies the manufacturability of superconducting devices based on NbGe in comparison to high-temperature superconductors.

Figure 8A:
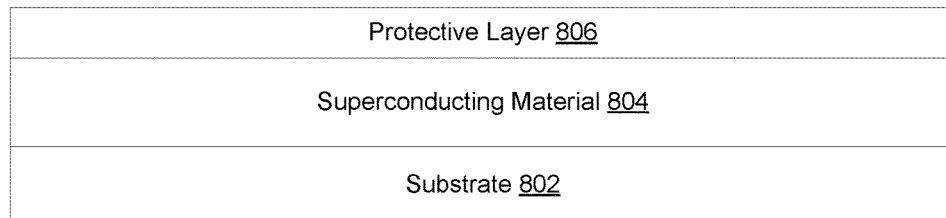
FIGS. 8A-8C are cross-sectional diagrams illustrating a representative fabrication sequence for a superconducting wire in accordance with some embodiments.
Figure 8B:
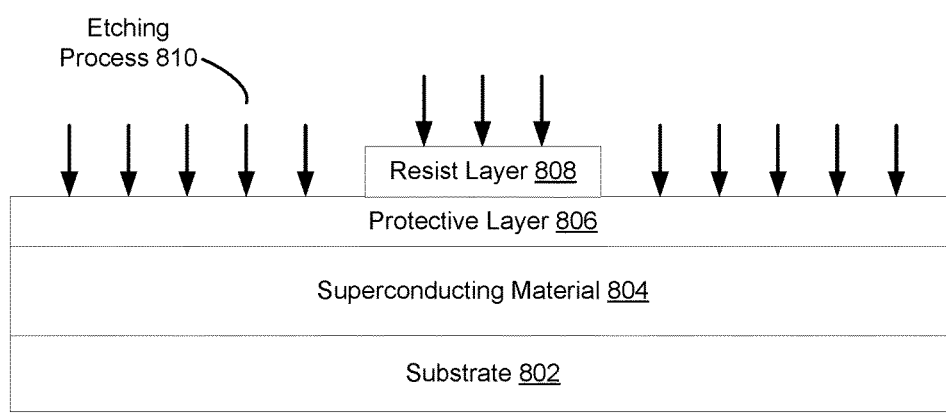
Figure 8C:
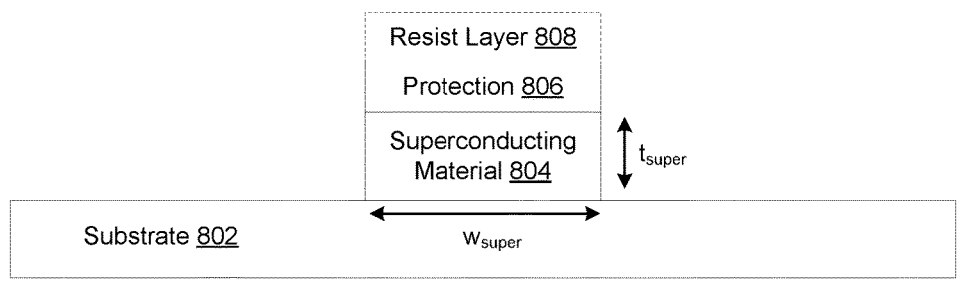

FIGS. 8A-8C are cross-sectional diagrams illustrating a representative fabrication sequence for a superconducting wire in accordance with some embodiments. FIG. 8A shows application of a superconducting material 804 on a substrate 802, and application of a protective layer 806 on the superconducting material 804. In some embodiments, the substrate is a silicon-based substrate, such as a silicon nitride (SiN) substrate. In some embodiments, the substrate does not include an oxide layer, so as to reduce or prevent oxidation of the superconducting material 804. In some embodiments, the superconducting material 804 is a niobium-based superconducting material, such as niobium-germanium. In some embodiments, the superconducting material 804 is a thin-film of niobium-germanium (e.g., a film having a thickness less than 100 nm, 50 nm, or 20 nm). In some embodiments, the protective layer 806 includes a passivation layer, such as a passivation layer composed of aluminum nitride (AlN). In some embodiments, the protective layer 806 consists essentially of a dielectric material. In some embodiments, the protective layer 806 is, or includes, an oxide layer. In some embodiments, the protective layer 806 does not include an oxide layer, so as to reduce, inhibit, or prevent oxidation of the superconducting material 804. In some embodiments, the protective layer 806 is a thin film (e.g., a thin having a thickness of less than 20 nm, 10 nm, 2 nm, or 1 nm).

FIG. 8B shows the addition of a resist layer 808 on the surface of the protective layer 806. In some embodiments, the resist layer 808 is composed of a polymer. In some embodiments, the resist layer 808 is a photo-resist layer and/or an electro-resist layer. In some embodiments, the resist layer 808 is patterned. For example, as shown in FIG. 8B, the resist layer 808 covers only a portion of the protective layer 806. In some embodiments, the resist layer 808 is applied to only select portion(s) of the protective layer 806 (e.g., via the use of masks and the like). In some embodiments, the resist layer 808 is applied to the protective layer 806 and then portions of the resist layer 808 are removed (e.g., by the application of photons and/or electrons to cause cross-linking in portions of the resist layer followed by subsequent removal of photo resists that have not been cross-linked).

As also shown in FIG. 8B, the layers 808, 806, and 804 are exposed to an etching process 810 (e.g., dry etching or wet etching) in accordance with some embodiments. The resist layer 808 is adapted to resist the etching process 810, while the protective layer 806 and the superconducting material 804 are not adapted to resist the process, in accordance with some embodiments.

FIG. 8C shows the layers 808, 806, and 804 after application of the etching process 810. As shown in FIG. 8C, application of the etching process 810 removes portions of the protection layer 806 and the superconducting material 804 that are not covered by the resist layer 808. In some embodiments, after etching, the superconducting material 804 has a width, denoted $w_{super}$, less than 100 nm, such as in the range of 10 nm to 50 nm. In some embodiments, the superconducting material 804 has a thickness, denoted $t_{super}$, less than 20 nm, such as in the range of 3 nm to 10 nm. In some embodiments, the protective layer 806 has a same or similar width and thickness as the superconducting material 804, such as a width in the range of 10 nm to 50 nm and a thickness in the range of 20 nm to 3 nm. In some embodiments, the resist layer 808 is subsequently removed (e.g., via the application of a stripper, such as acetone, 1-methyl-2-pyrrolidon, etc.). In some embodiments, the superconducting material 804 shown in FIG. 8C is a superconducting wire (e.g., a superconducting nanowire).

In some embodiments, after the etching process 810, the superconducting material 804 forms one or more nanowires. In some embodiments, the one or more nanowires are adapted (e.g., by varying thickness and/or width) to have a threshold temperature (e.g., a temperature above which the nanowires cannot operate in the superconducting state) above 10 Kelvin, e.g., between 10 Kelvin and 30 Kelvin. In some embodiments, a superconducting operating temperature of the one or more nanowires is set to be around ¼ (e.g., within 5%, 10%, 20%) of the nanowire(s) threshold temperature. In some embodiments, the one or more nanowires are adapted to have a superconducting operating temperature between 3 Kelvin and 5 Kelvin, 20 Kelvin, or 100 Kelvin.

Figure 9:
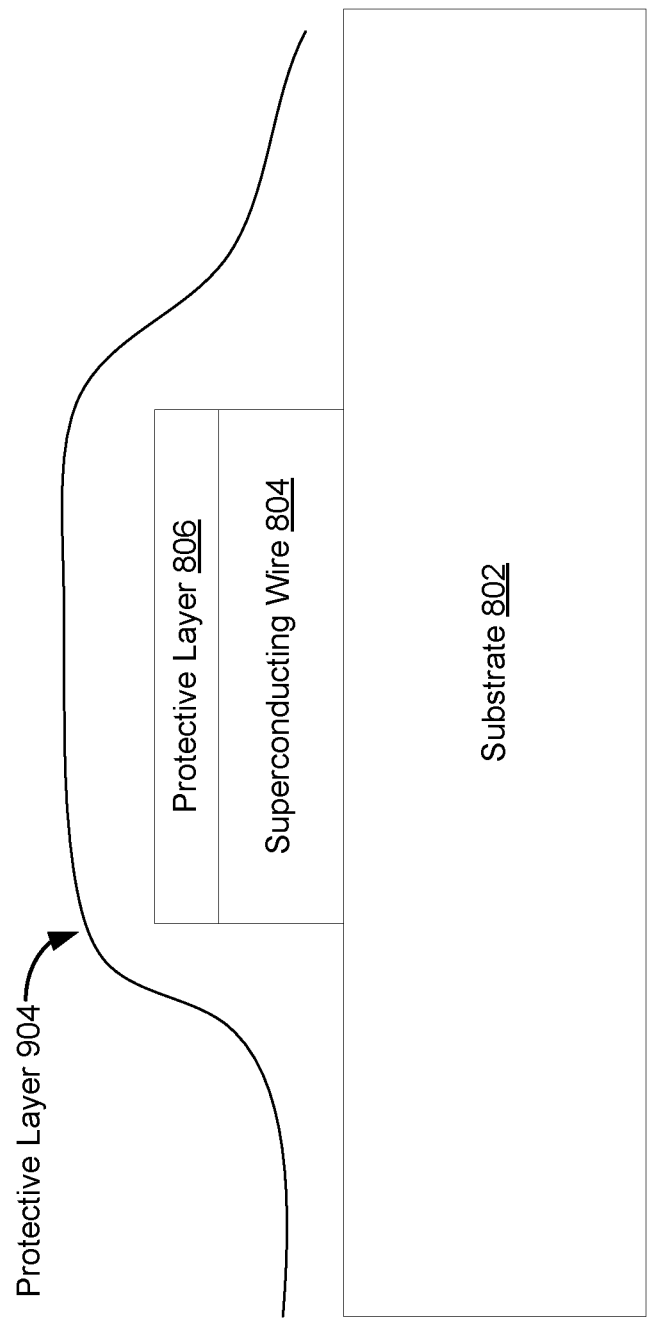
FIG. 9 is a cross-sectional diagram illustrating a representative layering for a superconducting wire in accordance with some embodiments.

FIG. 9 is a cross-sectional diagram illustrating a representative layering for a superconducting wire in accordance with some embodiments. FIG. 9 shows the superconducting wire 804 on the substrate 802 with the protective layer 806 on top of the superconducting wire 804. FIG. 9 also shows application of a second protective layer 904 over the superconducting wire 804 (e.g., to the sides of the superconducting wire 804 and on top of the protective layer 806). In some embodiments, the second protective layer 904 is a dielectric layer. In some embodiments, the second protective layer 904 consists essentially of a dielectric material. In some embodiments, the second protective layer 904 is, or includes, an oxide layer. In some embodiments, the second protective layer 904 does not include an oxide layer, so as to inhibit oxidation of the superconducting material 804. In some embodiments, the second protective layer 904 is composed of aluminum nitride. In some embodiments, the second protective layer 904 is composed of a same material as the protective layer 806 (e.g., aluminum nitride). In some embodiments, the second protective layer 904 is a carbon-based dielectric material.

In some embodiments, the second protective layer 904 is applied on top of a resist layer (e.g., resist layer 808) that covers the protective layer 806. In some embodiments, the protective layer 806 is removed prior to application of the protective layer 904, such that the protective layer 904 is applied to a top surface of the superconducting wire 804. In some embodiments, the second protective layer 904 is applied via a sputtering process (e.g., at temperatures greater than 300 degrees Celsius, such as 400 degrees to 800 degrees Celsius). In some embodiments, the second protective layer 904 is a thin film (e.g., a thin having a thickness of less than 20 nm, 10 nm, or 5 nm).

Figure 10:
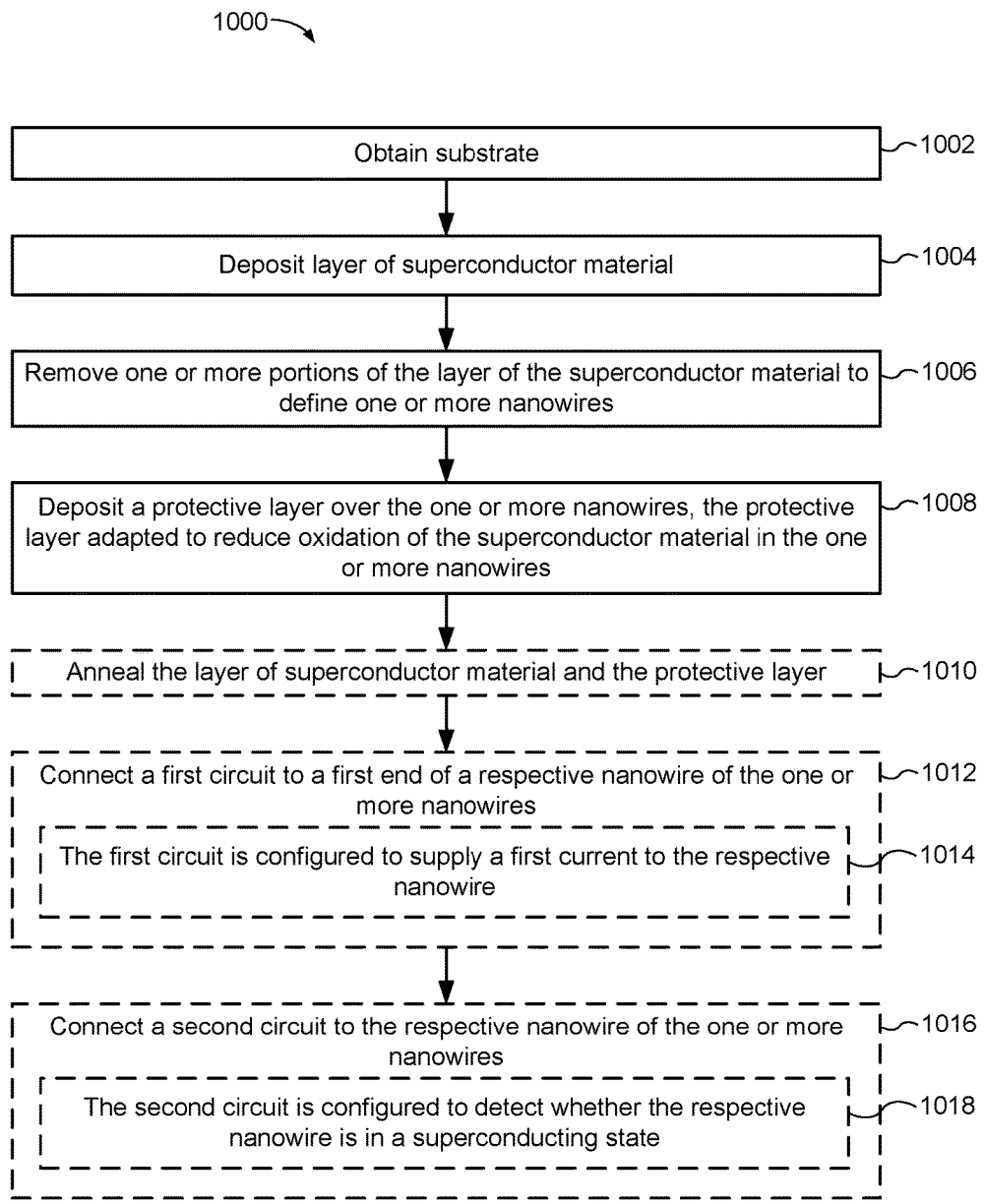
FIG. 10 is a flow diagram illustrating a representative method of fabricating a superconducting circuit in accordance with some embodiments.

FIG. 10 is a flow diagram illustrating a method 1000 of fabricating a superconducting circuit in accordance with some embodiments. In some embodiments, the method 1000 is performed within a vacuum system (e.g., with a pressure below $10^{-5}$, $10^{-7}$, or $10^{-9}$ Torr). In some embodiments, the method 1000 is performed under vacuum, e.g., while maintaining a vacuum state (e.g., with an atmospheric pressure below $10^{-5}$ Torr) around the substrate. In some embodiments, the method 1000 is performed without breaking the vacuum state. For example, operations 1004 through 1008 are performed without removing the vacuum state (e.g., without removing the substrate from the vacuum system or releasing the vacuum within the vacuum system).

A substrate (e.g., substrate 802) is obtained (1002). In some embodiments, the substrate is a silicon-based substrate, such as a silicon nitride (SiN) substrate. In some embodiments, the substrate does not include an oxide layer, so as to reduce or prevent oxidation of a superconducting material.

A layer of superconductor material (e.g., superconducting material 804) is deposited (1004) on the substrate. In some embodiments, the superconducting material is a niobium-based superconducting material, such as niobium-germanium (e.g., $Nb_3Ge$). In some embodiments, the superconducting material is, or includes, a thin-film of niobium-germanium (e.g., a film having a thickness less than 100 nm, 50 nm, or 20 nm).

One or more portions of the layer of superconductor material are removed (1006) to define one or more nanowires. In some embodiments, removing the one or more portions includes: (1) depositing a patterned resist layer (e.g., layer 808); and (2) etching away the portions of the superconductor material not covered by the resist layer.

A protective layer (e.g., layer 904) is deposited (1008) over the one or more nanowires. In some embodiments, the protective layer is adapted to reduce oxidation of the superconductor material in the one or more nanowires. In some embodiments, the protective layer includes a passivation layer, such as a passivation layer composed of aluminum nitride (AlN). In some embodiments, the protective layer is, or includes, amorphous silicon. In some embodiments, the protective layer consists essentially of a dielectric material. In some embodiments, the protective layer includes an oxide layer. In some embodiments, the protective layer does not include an oxide layer, so as to reduce, inhibit, or prevent oxidation of the superconducting material. In some embodiments, the protective layer is a thin film (e.g., a thin having a thickness of less than 20 nm, 10 nm, 2 nm, or 1 nm).

In some embodiments, the layer of superconductor material and the protective layer are annealed (1010). In some embodiments, the layer of superconductor material and the protective layer are annealed at a temperature between 800° and 1500° Celsius. In some embodiments, the layer of superconductor material and the protective layer are annealed in a nitrogen gas or vacuum environment. In some embodiments, the layer of niobium-germanium is annealed independently of the protective layer (e.g., without annealing the protective layer).

In some embodiments, a first circuit (e.g., the current source 110) is connected (1012) to a first end of a respective nanowire of the one or more nanowires. In some embodiments, the first circuit is configured (1014) to supply a first current to the respective nanowire (e.g., such that it operates in a superconducting state).

In some embodiments, a second circuit (e.g., circuit 108) is connected (1016) to the respective nanowire of the one or more nanowires. In some embodiments, the second circuit is configured to detect whether the respective nanowire is in a superconducting state.

In accordance with some embodiments, a method for fabricating a superconducting wire includes: (1) depositing a layer of niobium-germanium (e.g., superconducting material 804); (2) removing one or more portions of the layer of niobium-germanium to define one or more nanowires (e.g., as shown in FIGS. 8B-8C); and (3) depositing a protective layer over the one or more nanowires (e.g., protective layer 904 in FIG. 9). In some instances, the protective layer reduces or prevents oxidation of niobium-germanium in the one or more nanowires. In some embodiments, the protective layer is deposited after the one or more portions of the layer of niobium-germanium are removed to define the one or more nanowires. In some embodiments, the depositing of the niobium-germanium, the removing, and the depositing of the protective layer are performed within a vacuum (e.g., with the depositing being conducted in a deposition chamber having total pressure less than $10^{-5}$ Torr, $10^{-7}$ Torr, or $10^{-9}$ Torr). In some embodiments, the depositing of the niobium-germanium, the removing, and the depositing of the protective layer are performed on a substrate without removing the substrate from a vacuum during the process.

In some embodiments, the nanowires are defined by a patterned resist layer deposited on top of the layer of niobium-germanium. In some embodiments, a reactive ion etch process (e.g., a $CF_4$ reactive ion etch process) transfers the pattern of the resist layer to the niobium-germanium layer.

In some embodiments, the layer of niobium-germanium is deposited by physical vapor deposition. In some embodiments, the layer of niobium-germanium is deposited at a temperature between 400 and 800° Celsius. In some embodiments, the layer of niobium-germanium is deposited by sputtering. In some embodiments, the method of manufacture for the niobium-germanium layer is fully CMOS BEOL (back end of line) compatible, with a growth temperature of 400° Celsius or less.

In some embodiments, the method further includes depositing a second protective layer over the layer of niobium-germanium (e.g., protective layer 806). In some embodiments, the second protective layer is deposited before the one or more portions of the layer of niobium-germanium are removed to define the one or more nanowires. In some embodiments, removing the one or more portions of the layer of niobium-germanium to define the one or more nanowires includes removing one or more corresponding portions of the second protective layer.

In some embodiments, the method further includes annealing the layer of niobium-germanium and the second protective layer. In some embodiments, the layer of niobium-germanium and the second protective layer are annealed at a temperature between 800° and 1500° Celsius. In some embodiments, the layer of niobium-germanium and the second protective layer are annealed in a nitrogen gas or vacuum environment. In some embodiments, the layer of niobium-germanium is annealed independently of the second protective layer (e.g., without annealing second protective layer).

In some embodiments, the method includes coupling a first end of a resistor to a first end of the first superconducting wire and coupling a second end of the resistor, opposite to the first end of the resistor, to a first end of the second superconducting wire.

In some embodiments, the method includes coupling a second end of the first superconducting wire that is opposite to the first end of the first superconducting wire, to a second end of the second superconducting wire that is opposite to the first end of the second superconducting wire.

In light of these principles and embodiments, we now turn to certain additional embodiments.

In accordance with some embodiments, a photodetector device (e.g., superconducting circuit 300) includes a superconducting nanowire composed of niobium-germanium (e.g., superconducting wire 202). In some embodiments, the niobium-germanium has an A-15 structure. In some embodiments, the niobium-germanium is in a beta-phase (e.g., the niobium-germanium has a body-centered cubic structure). In some embodiments, the superconducting nanowire is located on a substrate (e.g., a silicon nitride substrate). In some embodiments, the photodetector device includes a superconducting nanowire single-photon detector. In some embodiments, the photodetector device is configured to operate in a saturated efficiency mode at 3-5 Kelvin. In some embodiments, the photodetector device is configured to detect near-infrared photons. In some embodiments, the photodetector device is configured to determine whether a probabilistic single-photon source has emitted a photon at a given time. In some embodiments, the superconducting nanowire is configured to be sensitive to single photons incident to the nanowire (e.g., photons having infrared or near-infrared wavelengths).

In some embodiments, at least a portion of the superconducting nanowire consists of the niobium-germanium. In some embodiments, the superconducting nanowire consists essentially of a niobium-germanium alloy. In some embodiments, the niobium-germanium includes niobium and germanium in a ratio from 3:1 to 3.5:1 (e.g., $Nb_3Ge$).

In some embodiments, the superconducting nanowire has a width that is less than 500 nm. In some embodiments, the superconducting nanowire has a width between 10 and 50 nm. In some embodiments, the superconducting nanowire has a thickness between 2 nm and 10 nm. In some embodiments, the superconducting nanowire has a length between 100 nm and 300 nm.

In some embodiments, the photodetector device further includes a first protective layer (e.g., protective layer 806) located over the superconducting nanowire. In some embodiments, the first protective layer is composed of aluminum nitride. In some embodiments, the first protective layer has a thickness of 1 nm. In some embodiments, the first protective layer is, or includes, a passivation layer. In some embodiments, the first protective layer is a thin film (e.g., with a thickness of 10 nm, 5 nm, or 1 nm).

In some embodiments, the photodetector device further includes a second protective layer (e.g., protective layer 904) configured to encapsulate at least a portion of the niobium-germanium in the superconducting nanowire. In some embodiments, the second protective layer is configured to reduce or prevent oxidation of the niobium-germanium in the superconducting nanowire. In some embodiments, the second protective layer is, or includes, amorphous silicon. In some embodiments, the second protective layer includes aluminum nitride. In some embodiments, the second protective layer is made of aluminum nitride (AlN). In some embodiments, the second protective layer includes carbon. In some embodiments, the second protective layer is made of carbon. In some embodiments, the second protective layer has a thickness between 5 nm and 10 nm. In some embodiments, the photodetector device includes the second protective layer, but not the first protective layer. In some embodiments, the photodetector device includes one or more layers between the first protective layer and the second protective layer.

In some embodiments, the second protective layer is configured to encapsulate at least a portion of the first protective layer and at least the portion of the niobium-germanium in the superconducting nanowire.

In some embodiments: (1) the superconducting nanowire has a first maximum superconducting current; and (2) the device further includes: (a) a first circuit (e.g., current source 110 and/or activation circuitry 108) connected to (or electrically coupled to) a first end of the superconducting nanowire, the first circuit configured to supply a first current (e.g., current 402) that is less than the first maximum superconducting current; and (b) a second circuit (e.g., circuit 108) connected to (or electrically coupled to) the first end of the superconducting nanowire. In some instances, in response to receiving light of first intensity (e.g., photon(s) 406) at the superconducting nanowire, the superconducting nanowire transitions from a superconducting state to a non-superconducting state, thereby redirecting at least a portion of the first current toward the second circuit.

In some embodiments, the superconducting nanowire is configured to operate in the superconducting state prior to receiving the light of first intensity. In some embodiments, the superconducting nanowire is configured to operate in the superconducting state while receiving the first current and prior to receiving the light of first intensity. In some embodiments, the received light is infrared or near-infrared light.

In accordance with some embodiments, a method for operating the photodetector device includes maintaining the superconducting nanowire in a superconducting state at a temperature above 3 Kelvin (e.g., between 3.1 Kelvin and 10 Kelvin). In some embodiments, the superconducting nanowire is maintained at a temperature above 3.5 Kelvin. In some embodiments, the superconducting nanowire is maintained at a temperature between 3.5 and 5 Kelvin. In some embodiments, the superconducting nanowire is maintained at a target temperature between 3.5 and 5 Kelvin.

In some embodiments, the method further includes providing the first current to the superconducting nanowire (e.g., via current source 110). In some embodiments, providing the first current includes selectively providing the first current in response to external stimulus.

In some embodiments, the method further includes measuring, using the second circuit, the portion of the first current redirected toward the second circuit, to determine whether the light of first intensity has been received at the superconducting wire. In some embodiments, the method includes determining whether the light of first intensity has been received at the superconducting wire based on a current detected using the second circuit.

In some embodiments, the method further includes providing the light of first intensity to the superconducting wire (e.g., using a photon generator or photon pump). In some embodiments, the method further includes determining whether a probabilistic single-photon source has emitted a photon at a given time.

The devices described herein are merely illustrative. One skilled in the art would recognize that other devices having differing structure and function can be composed of, and fabricated, using niobium-germanium without departing from the scope of the present disclosure. For example, devices include, but are not limited to, signal amplifiers as described in International (PCT) Application PCT/US18/33042; nanowire transistors as described in U.S. Provisional Application No. 62/591,600; impedance amplifiers as described in U.S. Provisional Application No. 62/585,436; and superconducting FPGAs as described in U.S. Provisional Application No. 62/660,192, the disclosures of which are incorporated by reference in their entireties for all purposes.

Furthermore, in accordance with one or more embodiments, niobium-germanium is optionally employed in any type of superconducting device without departing from the scope of the present disclosure. For example, niobium-germanium thin films as disclosed herein are optionally employed in any device having a Josephson junction, such as a superconducting qubit, superconducting quantum interference device (SQUID), and the like. In addition, wires formed from niobium-germanium bulk embedded with other niobium compounds such as NbN are optionally used as wires and transmission lines, e.g., within superconducting magnets and the like.

Although some of various drawings illustrate a number of logical stages in a particular order, stages that are not order dependent may be reordered and other stages may be combined or broken out. While some reordering or other groupings are specifically mentioned, others will be obvious to those of ordinary skill in the art, so the ordering and groupings presented herein are not an exhaustive list of alternatives. Moreover, it should be recognized that the stages could be implemented in hardware, firmware, software or any combination thereof.

It will also be understood that, although the terms first, second, etc. are, in some instances, used herein to describe various elements, these elements should not be limited by these terms. These terms are only used to distinguish one element from another. For example, a first protective layer could be termed a second protective layer, and, similarly, a second protective layer could be termed a first protective layer, without departing from the scope of the various described embodiments. The first protective layer and the second protective layer are both protective layers, but they are not the same protective layer unless explicitly stated as such.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. A photodetector device, comprising:
    a superconducting nanowire composed of niobium-germanium;
    a protective layer configured to inhibit oxidation of the superconducting nanowire; and
    a current source configured to supply a current to the superconducting nanowire.

2. The device of claim 1, wherein the superconducting nanowire is adapted to operate in a superconducting state at temperatures between 3 Kelvin and 20 Kelvin.

3. The device of claim 1, wherein at least a portion of the superconducting nanowire consists essentially of the niobium-germanium.

4. The device of claim 1, wherein the niobium-germanium includes niobium and germanium in a ratio between 3:1 and 3.5:1.

5. The device of claim 1, further comprising a layer of aluminum nitride located over the superconducting nanowire.

6. The device of claim 1, wherein the protective layer encapsulates at least a portion of the niobium-germanium in the superconducting nanowire.

7. The device of claim 6, further comprising a layer of aluminum nitride located over the superconducting nanowire, wherein the protective layer encapsulates at least a portion of the layer of aluminum nitride and at least the portion of the niobium-germanium in the superconducting nanowire.

8. The device of claim 1, wherein the superconducting nanowire has a width between 10 nm and 50 nm.

9. The device of claim 1, wherein the superconducting nanowire has a thickness between 2 nm and 10 nm.

10. The device of claim 1, wherein the current is adapted to be less than a threshold superconducting current of the superconducting nanowire.

11. The device of claim 10, further comprising a second circuit coupled to the superconducting nanowire; and
    wherein the photodetector device is configured to, in response to receiving light of first intensity at the superconducting nanowire, transition the superconducting nanowire from a superconducting state to a non-superconducting state, thereby redirecting at least a portion of the current toward the second circuit.

12. The device of claim 11, wherein the superconducting nanowire is configured to operate in the superconducting state prior to receiving the light of first intensity.

13. A method, comprising:
    depositing a layer of niobium-germanium on a substrate;
    removing one or more portions of the layer of niobium-germanium to define one or more nanowires; and
    depositing a protective layer over the one or more nanowires, the protective layer adapted to inhibit oxidation of niobium-germanium in the one or more nanowires.

14. The method of claim 13, wherein the layer of niobium-germanium is deposited via physical vapor deposition.

15. The method of claim 13, wherein the layer of niobium-germanium is deposited via sputtering.

16. The method of claim 13, further comprising depositing a layer of aluminum nitride over the layer of niobium-germanium prior to depositing the protective layer.

17. The method of claim 16, wherein:
    the layer of aluminum nitride is deposited over the layer of niobium-germanium prior to removing the one or more portions of the layer of niobium-germanium; and
    removing the one or more portions of the layer of niobium-germanium includes removing corresponding one or more portions of the layer of aluminum nitride.

18. The method of claim 16, further comprising annealing the layer of niobium-germanium and the layer of aluminum nitride.

19. The method of claim 13, wherein the depositing the layer of niobium-germanium, the removing of the one or more portions, and the depositing of the protective layer are performed within a same vacuum state.

20. The method of claim 13, further comprising:
    forming a first circuit connected to a first end of a respective nanowire of the one or more nanowires and configured to supply a first current to the respective nanowire, wherein the first current is less than a first maximum superconducting current of the respective nanowire; and
    forming a second circuit connected to the first end of the respective nanowire, the second circuit configured to detect a current flowing through the second circuit.

21. The method of claim 13, wherein the wherein the layer of niobium-germanium is deposited at a temperature of less than 400 degrees Celsius.

* * * * *